US007286009B2

(12) United States Patent
Andersen et al.

(10) Patent No.: US 7,286,009 B2
(45) Date of Patent: Oct. 23, 2007

(54) DIGITAL PWM AMPLIFIER WITH SIMULATION-BASED FEEDBACK

(75) Inventors: Jack B. Andersen, Cedar Park, TX (US); Peter Craven, Thakeham (GB); Michael A. Kost, Cedar Park, TX (US); Daniel L. W. Chieng, Austin, TX (US); Larry E. Hand, Meridian, MS (US); Wilson E. Taylor, Austin, TX (US)

(73) Assignee: D2Audio Corporation, Austin, TX (US)

( * ) Notice: Subject to any disclaimer, the term of this patent is extended or adjusted under 35 U.S.C. 154(b) by 139 days.

(21) Appl. No.: 11/324,132

(22) Filed: Dec. 30, 2005

(65) Prior Publication Data

US 2007/0152750 A1    Jul. 5, 2007

(51) Int. Cl.
 *H03F 3/68* (2006.01)
(52) U.S. Cl. .................... 330/10; 330/251; 330/207 A
(58) Field of Classification Search ................ 330/10, 330/251, 207 A
See application file for complete search history.

(56) References Cited

U.S. PATENT DOCUMENTS 6,593,806 B1 *   7/2003   Melanson ..................... 330/10

* cited by examiner

*Primary Examiner*—Robert Pascal
*Assistant Examiner*—Hieu Nguyen
(74) *Attorney, Agent, or Firm*—Law Offices of Mark L. Berrier

(57) ABSTRACT

Systems and methods for performance improvements in digital switching amplifiers using simulation-based feedback. In one embodiment, a digital pulse width modulation (PWM) amplifier includes a signal processing plant configured to receive and process an input audio signal. The amplifier also includes a simulator configured to model processing of audio signals by the plant. The outputs of the plant and the simulator are provided to a subtractor, the output of which is then added to the input audio signal as feedback. The plant may consist of a modulator and power switch, a noise shaper, or any other type of plant. An analog-to-digital converter (ADC) may be provided to convert the output audio signal to a digital signal for input to the subtractor. Filtering may be implemented before or after the ADC, and a decimator may be placed after the ADC if it is an oversampling ADC.

20 Claims, 17 Drawing Sheets

Digital pulse width modulated amplifier including feedback according to the invention.

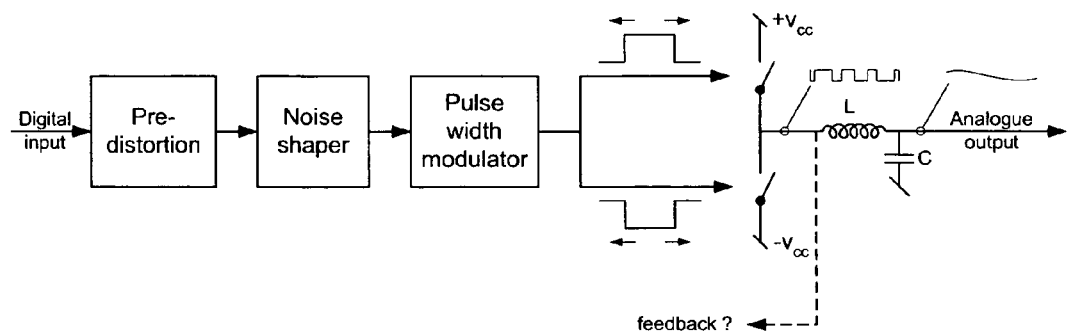
Figure 1: Digital pulse width modulated amplifier (prior art).
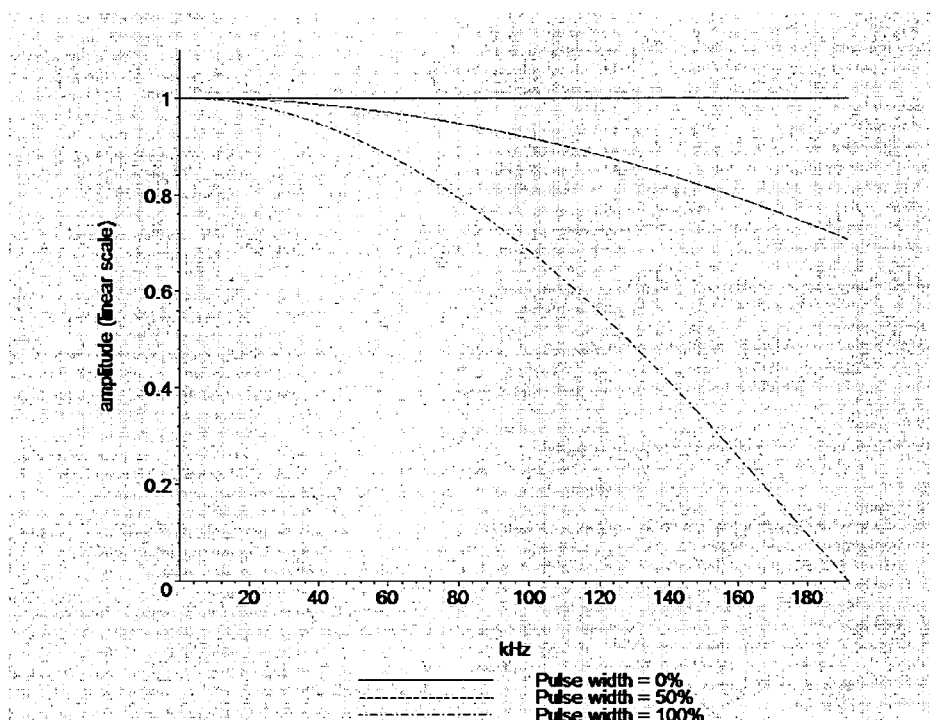
Figure 2: Small signal amplitude response of double edge (class AD or class BD) PWM modulator operating at 384kHz, with pulse width, as a percentage of the pulse repetition period, as parameter.

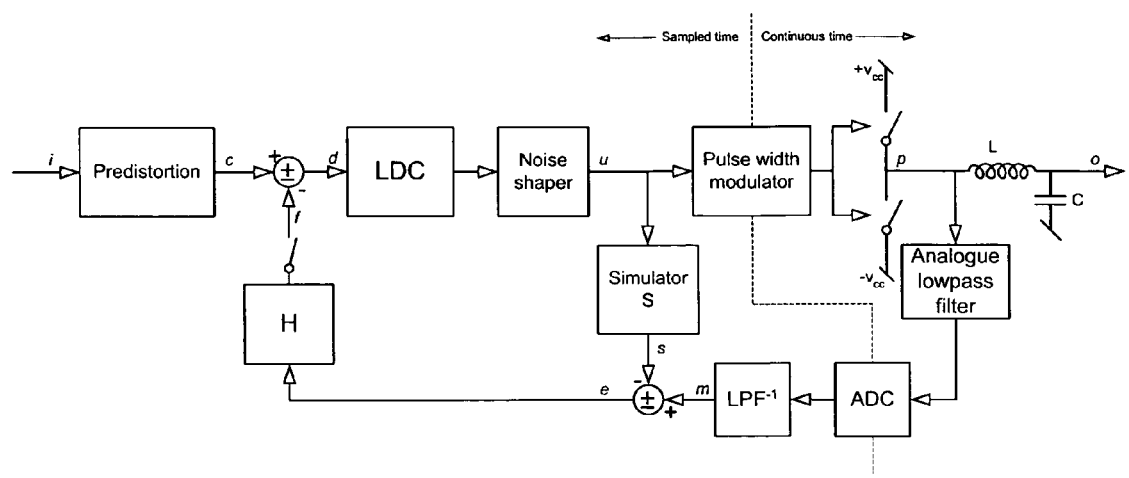
Figure 3: Digital pulse width modulated amplifier including feedback according to the invention.
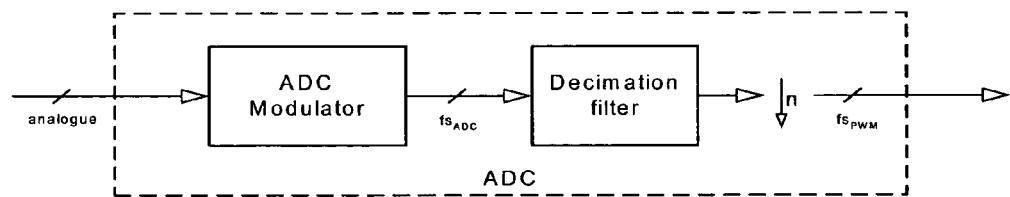
Figure 4: Internal structure of oversampling ADC.

| I | tap[i] | tap[16+i] | tap[32+i] | tap[48+i] | tap[64+i] |
|---|---|---|---|---|---|
| 0 | 0.01836739 | 0.03734201 | 0.02677137 | -0.03957508 | 0.01959769 |
| 1 | 0.01866660 | 0.04667572 | 0.00736557 | -0.02606826 | 0.01586066 |
| 2 | 0.02143722 | 0.04696125 | 0.00074389 | -0.02085951 | 0.01421720 |
| 3 | 0.02483227 | 0.04533122 | -0.00361645 | -0.01692403 | 0.01287703 |
| 4 | 0.02872951 | 0.04227169 | -0.00645628 | -0.01374983 | 0.01170496 |
| 5 | 0.03314426 | 0.03773281 | -0.00771946 | -0.01136110 | 0.01070354 |
| 6 | 0.03810359 | 0.03161875 | -0.00728109 | -0.00982844 | 0.00988724 |
| 7 | 0.04363611 | 0.02382738 | -0.00500662 | -0.00922910 | 0.00927228 |
| 8 | 0.04977115 | 0.01425356 | -0.00075672 | -0.00964369 | 0.00887575 |
| 9 | 0.05653861 | 0.00278953 | 0.00561224 | -0.01115590 | 0.00871557 |
| 10 | 0.06396901 | -0.01067506 | 0.01424800 | -0.01385236 | 0.00881045 |
| 11 | 0.07209334 | -0.02625270 | 0.02530191 | -0.01782231 | 0.00917978 |
| 12 | 0.08094214 | -0.04405447 | 0.03892357 | -0.02315400 | 0.00984276 |
| 13 | 0.09053434 | -0.06414651 | 0.05519613 | -0.02989119 | 0.01080718 |
| 14 | 0.10073951 | -0.08601366 | 0.07333889 | -0.03749679 | 0.01193171 |
| 15 | 0.10957716 | -0.10193945 | 0.08186866 | -0.03823784 | 0.01122776 |
Figure 5: Coefficients tap[0] through tap[79] of 80-tap FIR decimation filter.
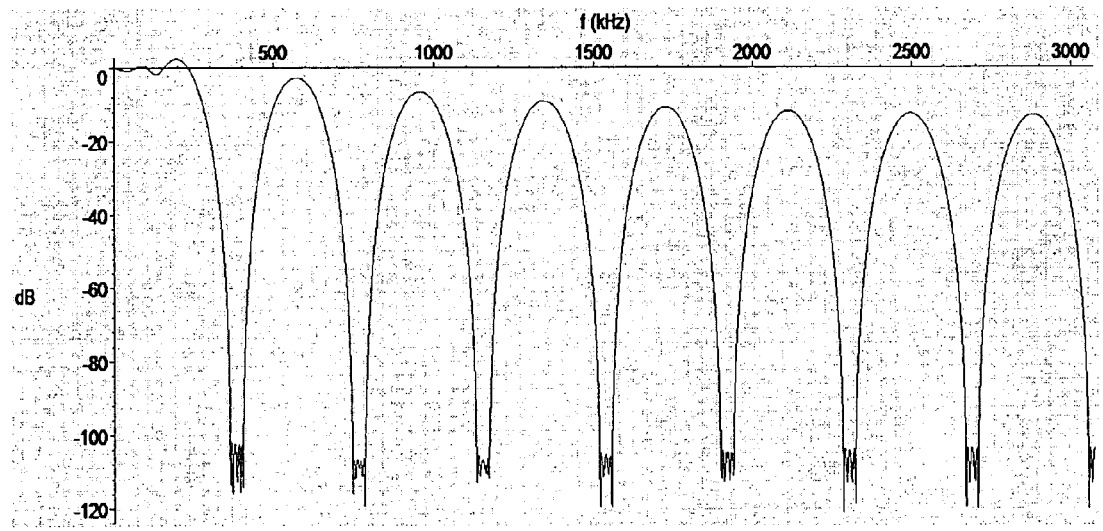
Figure 6: Amplitude response of 80-tap FIR decimation filter.

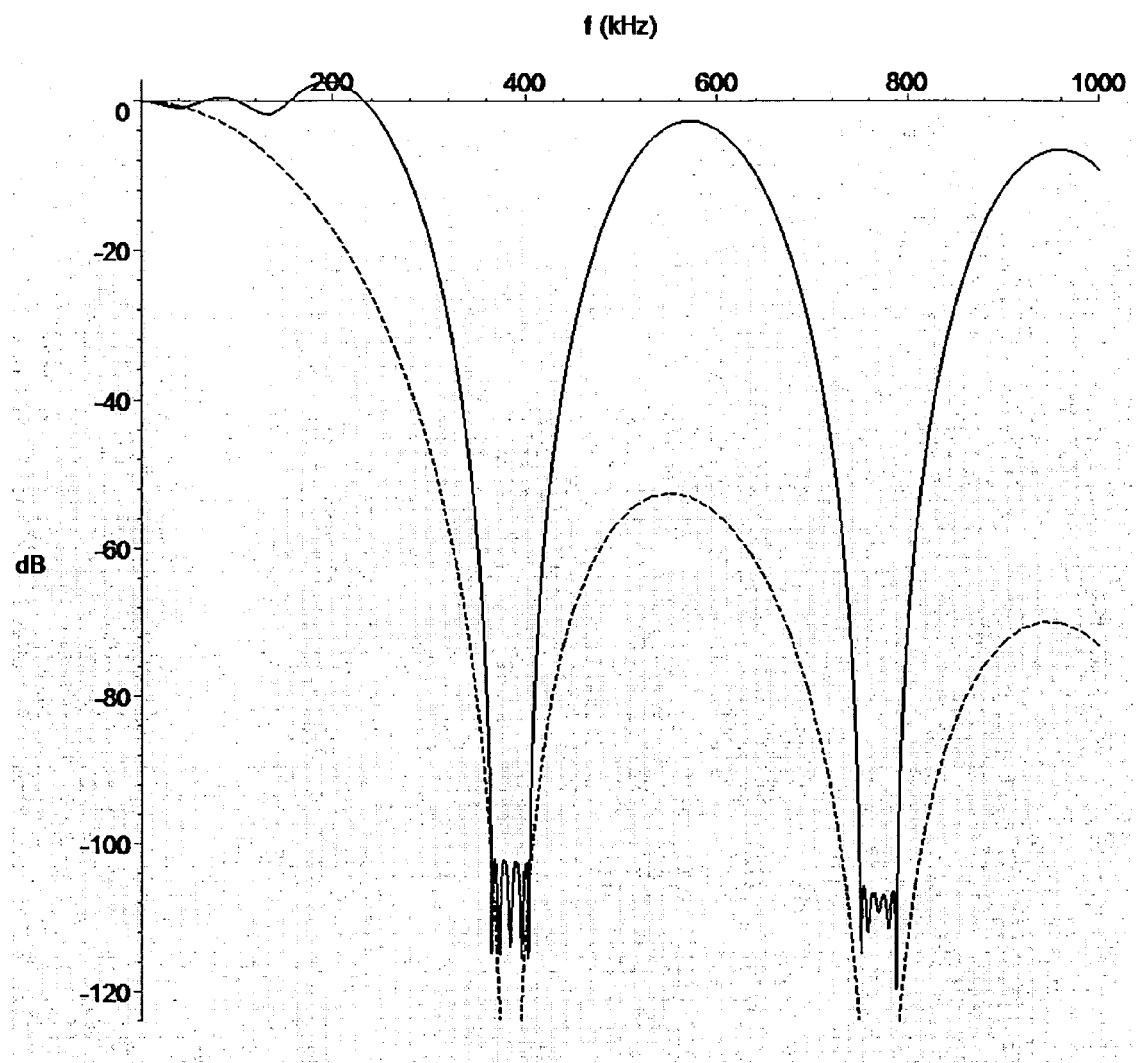
Figure 7: Amplitude response of 80-tap FIR decimation filter and (dashed) of cascade of four combs.

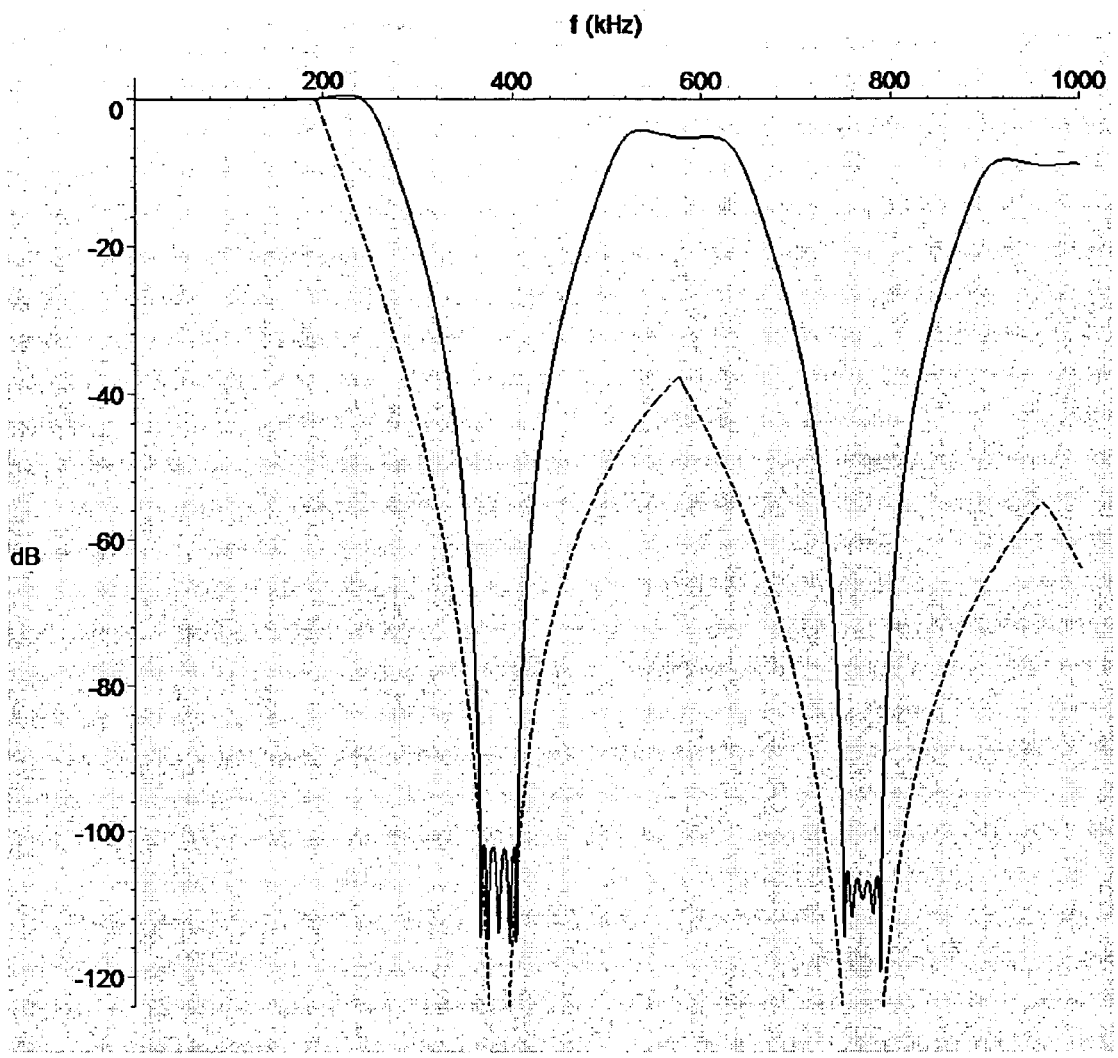
Figure 8: Alias attenuation of 80-tap FIR decimation filter and (dashed) of cascade of four combs.

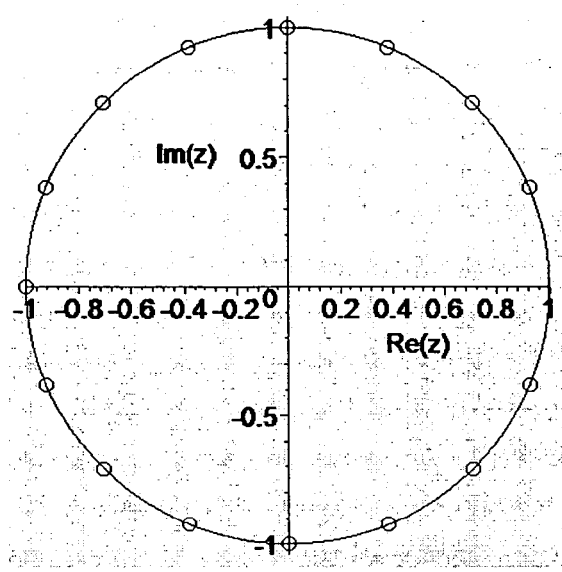
Figure 9: z-plane zeroes of a comb filter with eight equal taps.
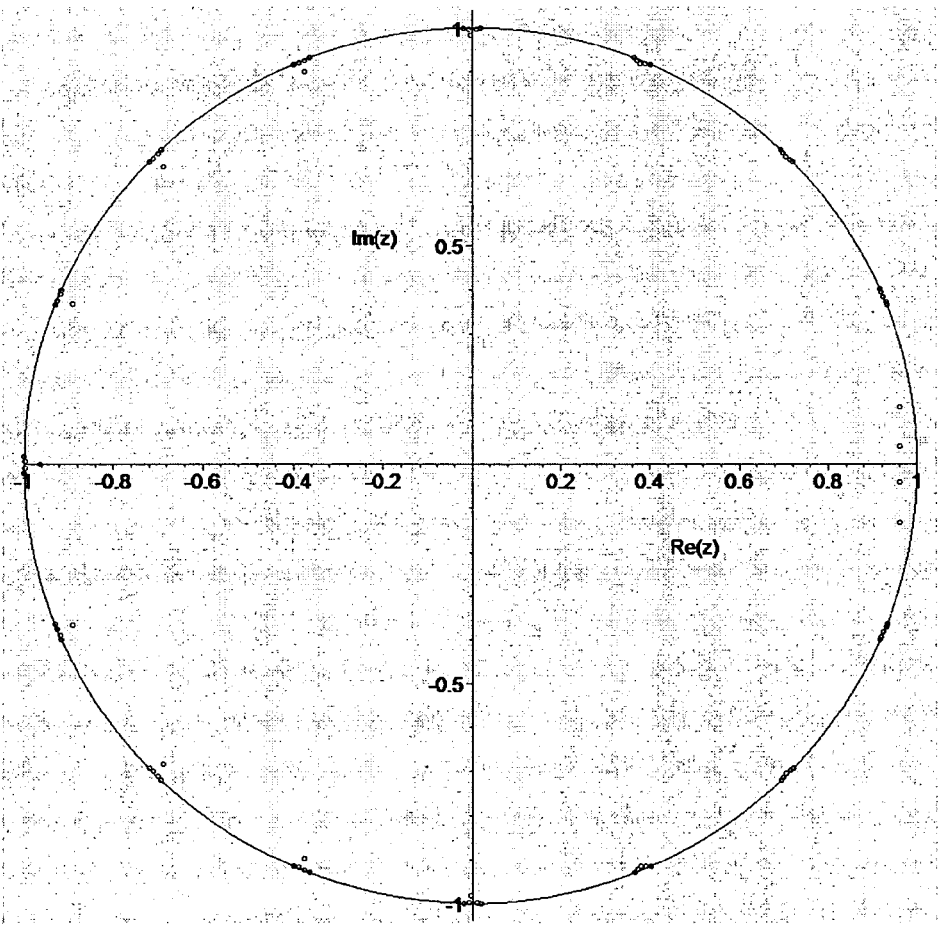
Figure 10: z-plane zeroes of 80-tap FIR decimation filter.

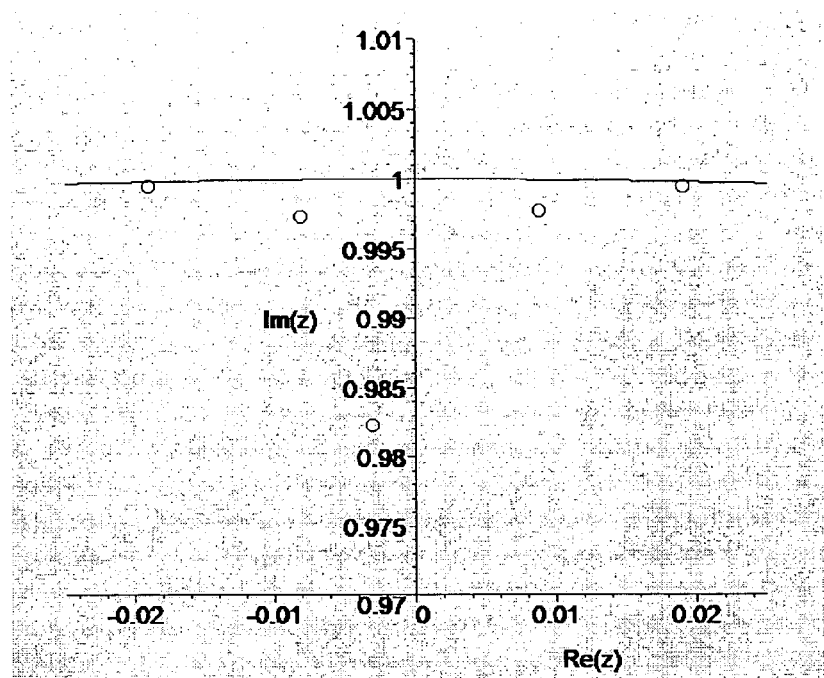
Figure 11: Close-up picture of five $z$-plane zeroes of 80-tap FIR decimation filter near to $z = 0 + 1i$
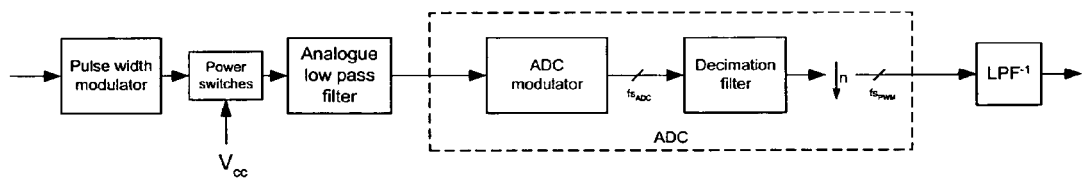
Figure 12: Measurement path.
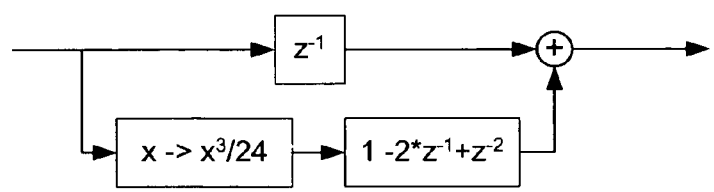
Figure 13: Low-frequency model of PWM nonlinearity

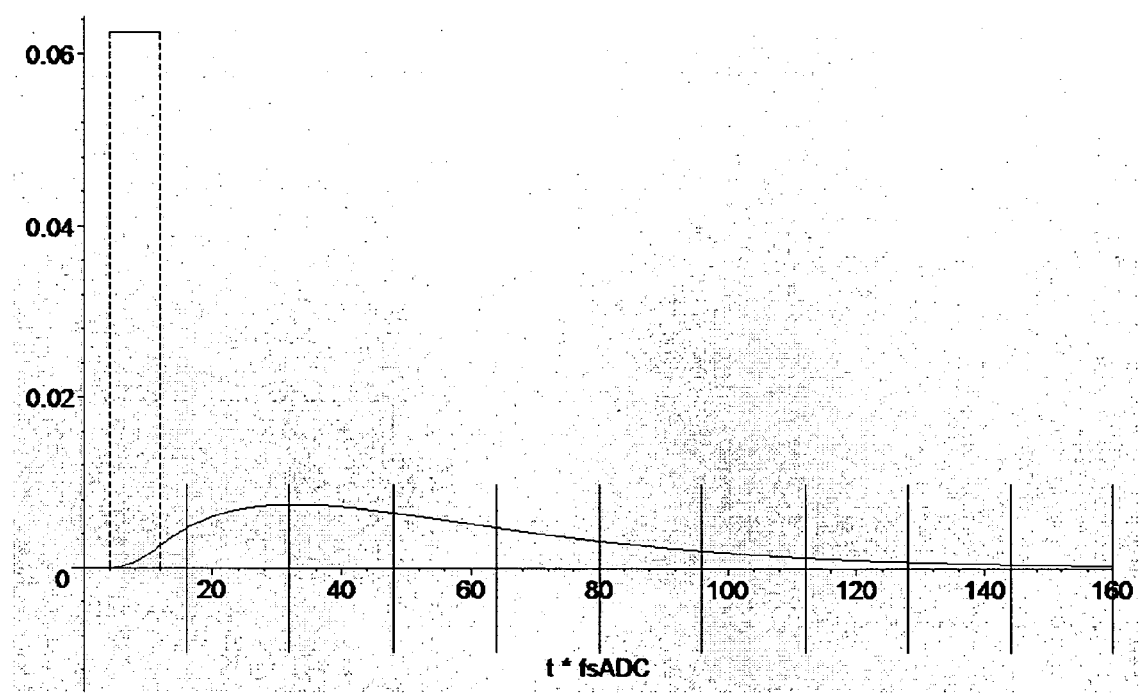
Figure 14: Response of analog lowpass filter to PWM pulse.

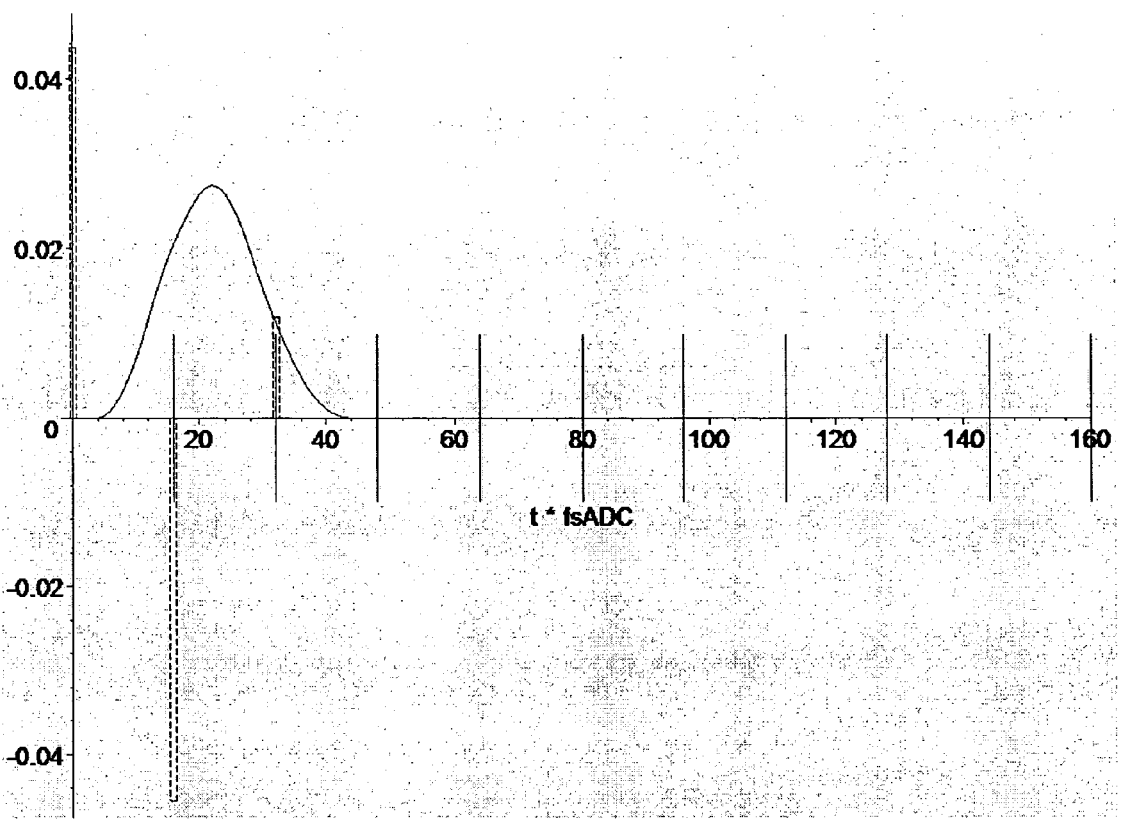
Figure 15: Sharpening of analog filter response using 3-point deconvolution filter.
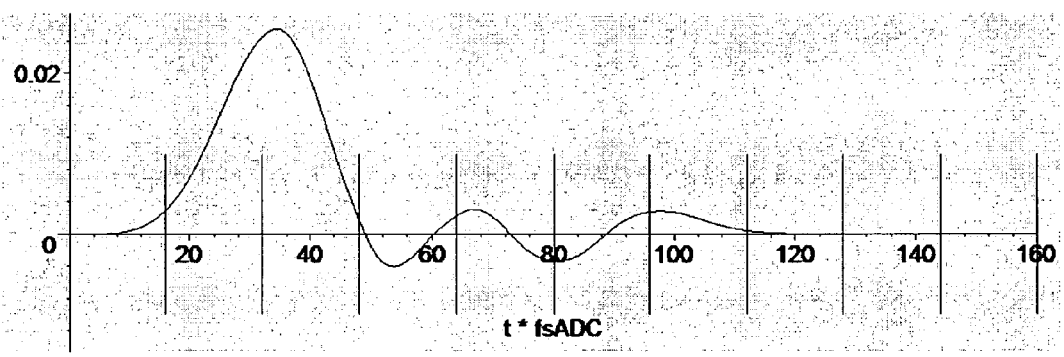
Figure 16: Response of 80-tap FIR decimation filter to sharpened analog filter response

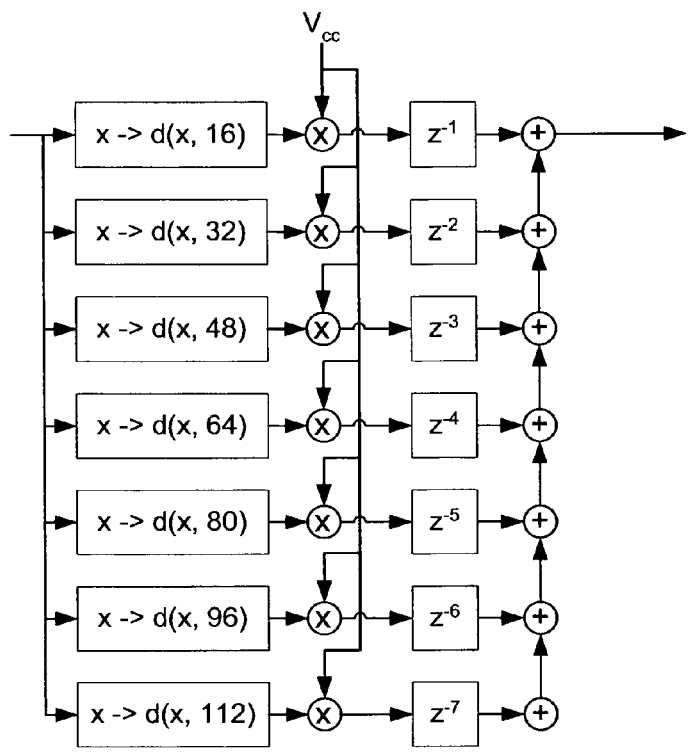
Figure 17: Conceptual model of measurement path.
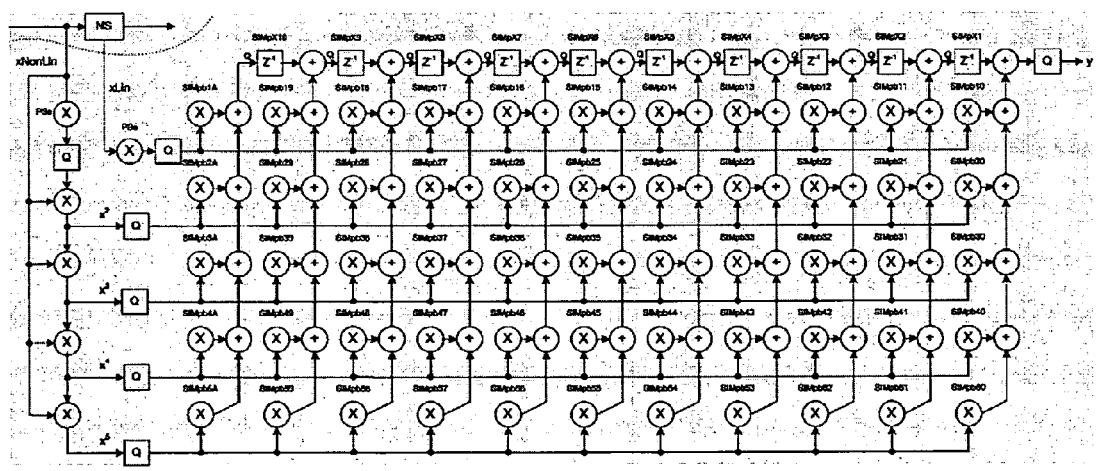
Figure 18: Practical simulator architecture.

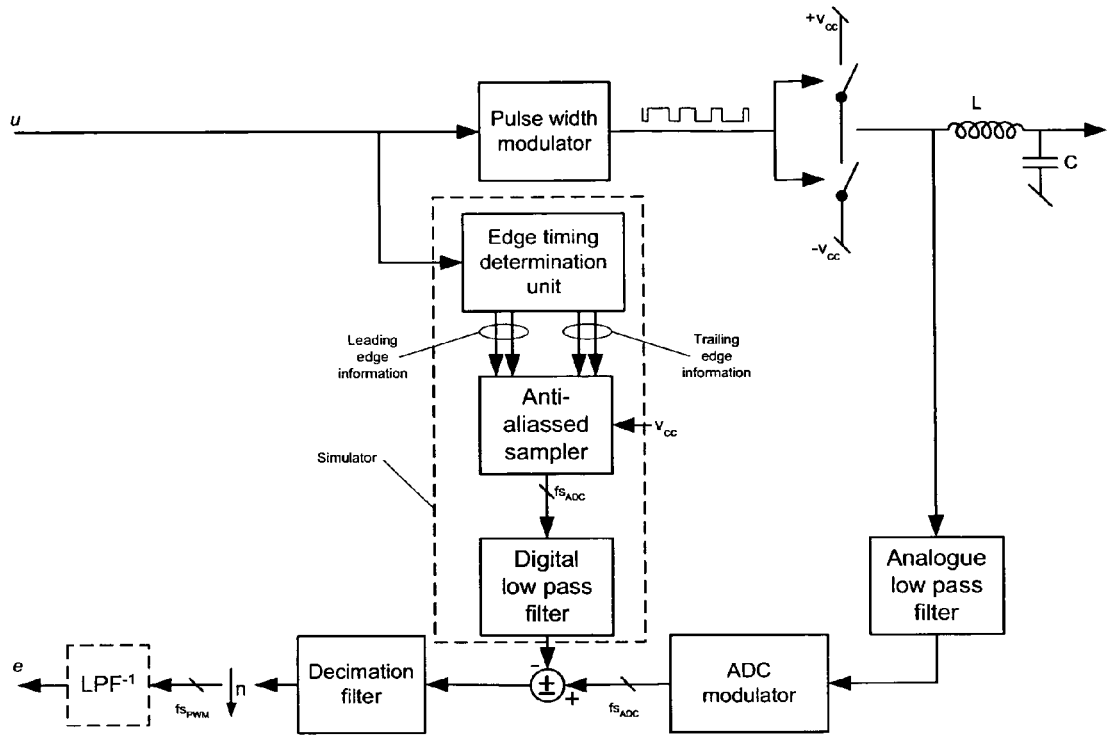
Figure 19: Amplifier detail incorporating alternative simulator.
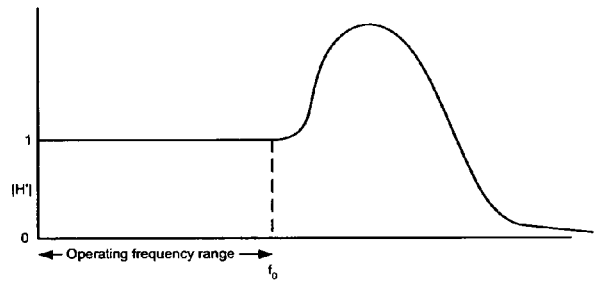
Figure 20: Amplitude response of prediction filter H'.
| i | H[i] | H[5+i] | H[10+i] | H[15+i] | H[20+i] |
|---|---|---|---|---|---|
| 0 | 0.82512274 | -1.49945807 | 0.65335414 | -0.47229215 | 0.45884075 |
| 1 | 1.62176745 | -0.58335573 | 0.46411603 | -0.44992039 | 0.31327908 |
| 2 | 1.03876942 | 0.24500844 | 0.17230418 | -0.30258804 | -0.02447150 |
| 3 | -0.56168225 | 0.64285441 | -0.14021477 | -0.02718102 | -0.22301130 |
| 4 | -1.66228078 | 0.72528491 | -0.37063281 | 0.29362142 | -0.13836652 |
Figure 21: Coefficients H[0] through H[24] of feedback filter H, implemented as 25-tap FIR

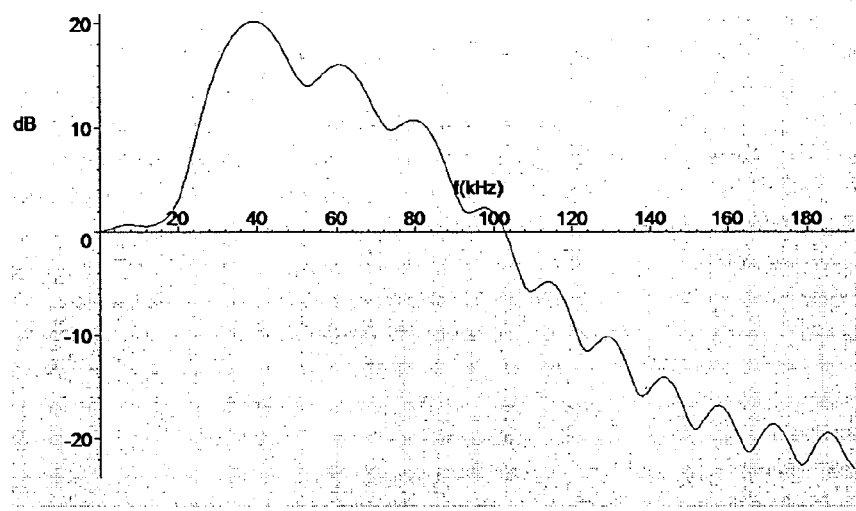
Figure 22: Amplitude response of the feedback filter H of Figure 21.
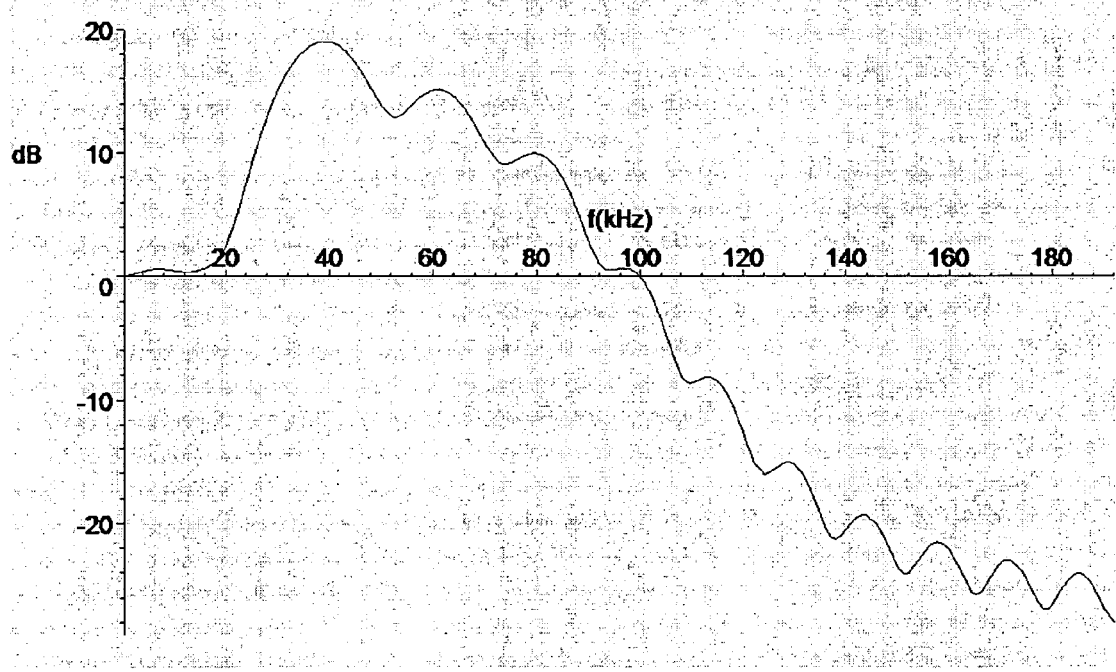
Figure 23: Magnitude of gain of feedback loop with simulator disabled.

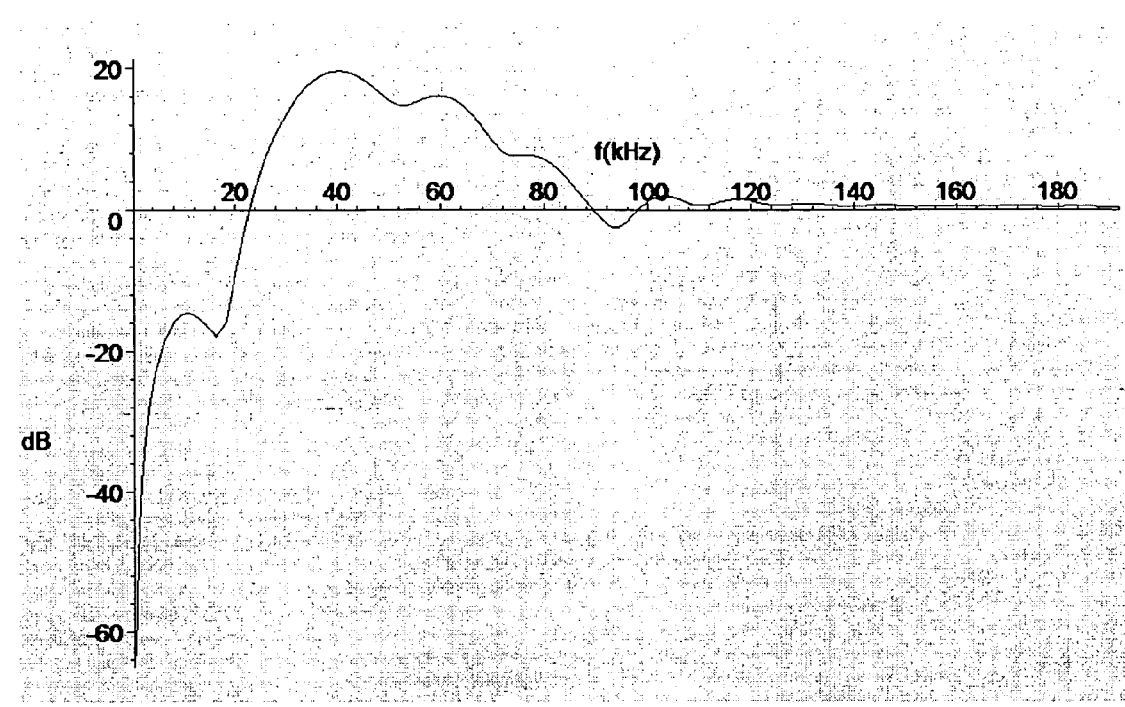
Figure 24: Magnitude of noise transfer function (NTF) of feedback loop.
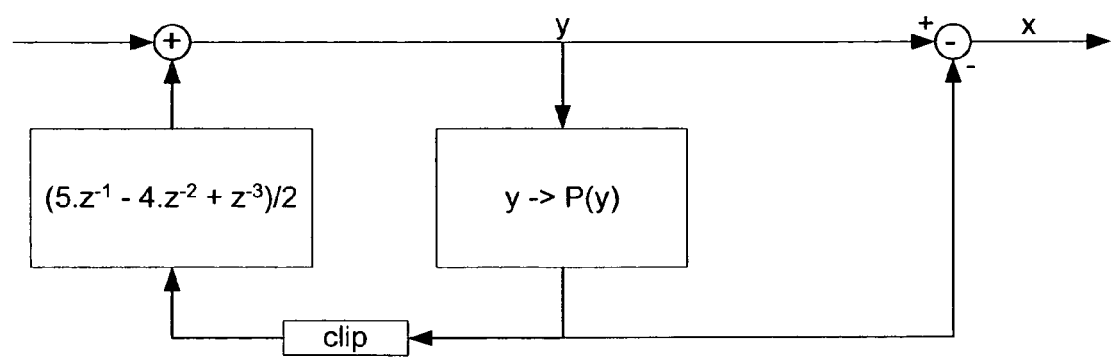
Figure 25: Low delay corrector unit LDC.

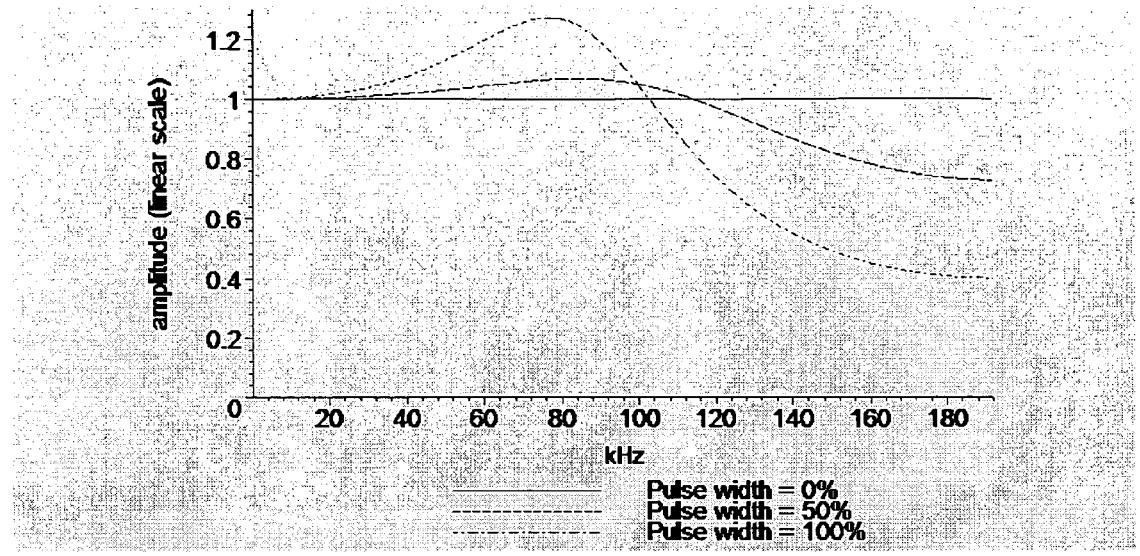

Figure 26: Small-signal amplitude response of low delay corrector unit of Figure 25, with pulse width as parameter.

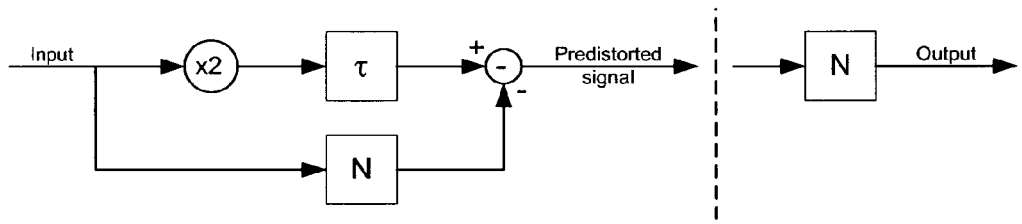

Figure 27: Gerzon first-order predistortion applied to nonlinear element N that approximates delay $\tau$.

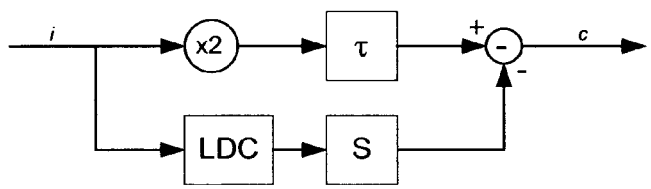

Figure 28: Gerzon predistortion unit adapted to compensate LDC and S.

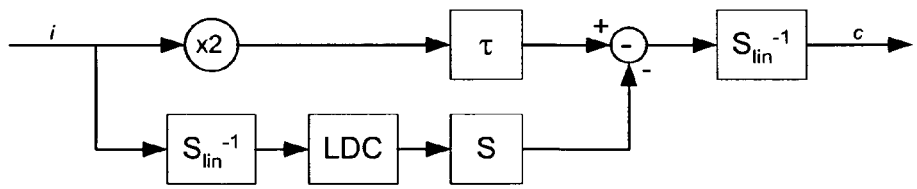

Figure 29: Gerzon predistortion unit incorporating correction for small-signal transfer function.

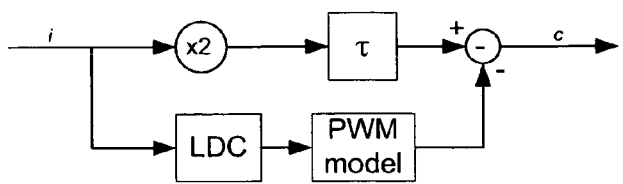
Figure 30: Gerzon predistortion unit adapted to compensate LDC and pulse width modulator.
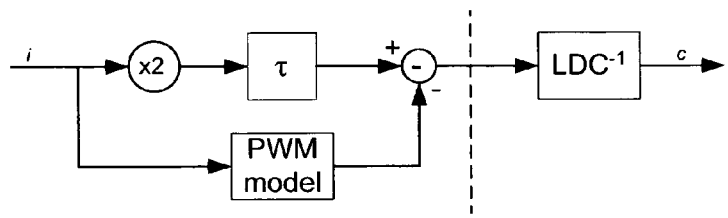
Figure 31: Gerzon predistortion unit adapted to compensate pulse width modulator, followed by compensator for LDC.
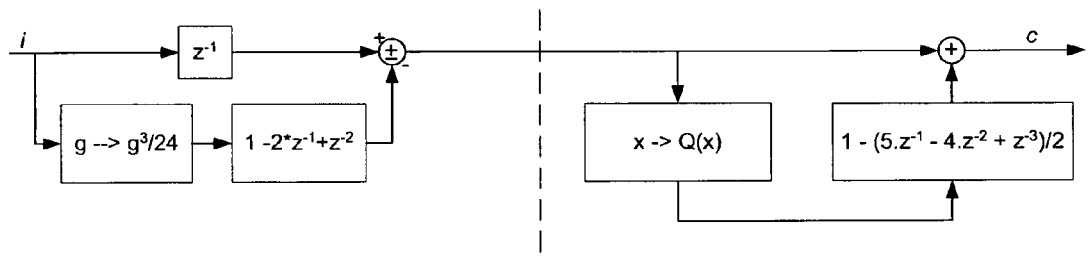
Figure 32: Detail of a predistortion unit using the principle of Figure 31.

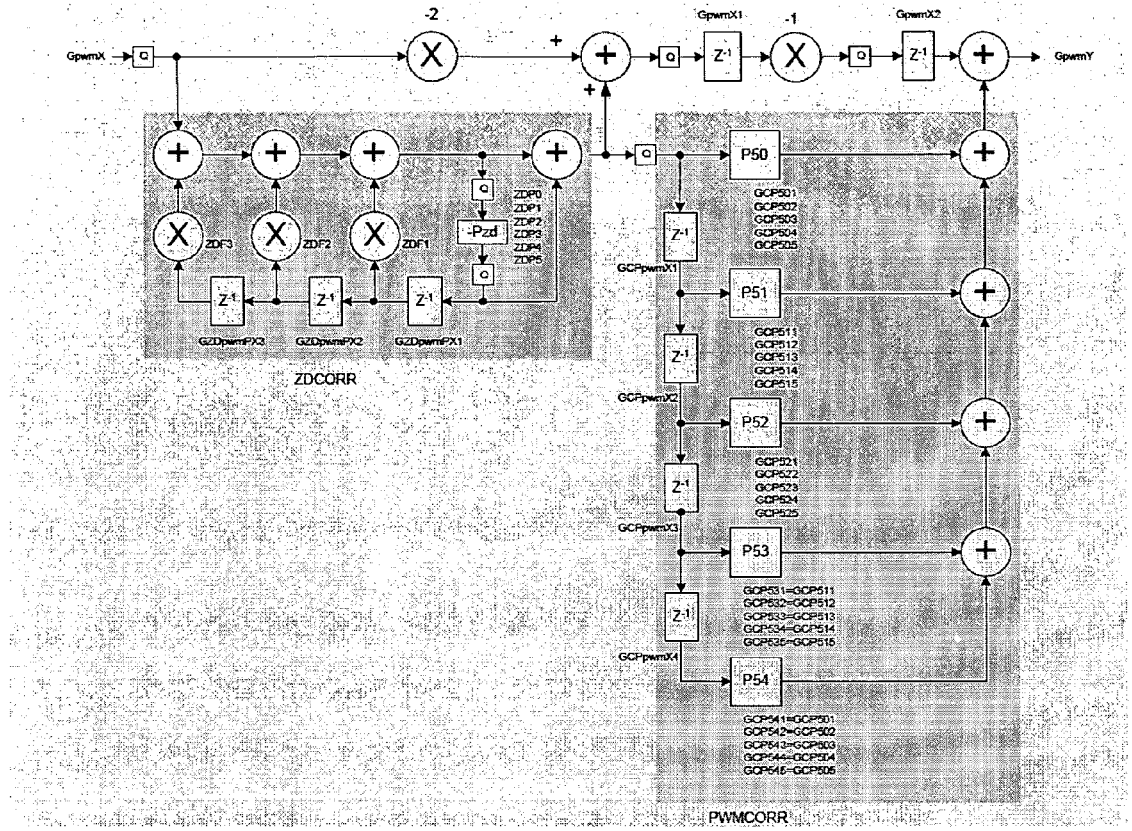
Figure 33: Detail of a predistortion unit using the principle of Figure 30.
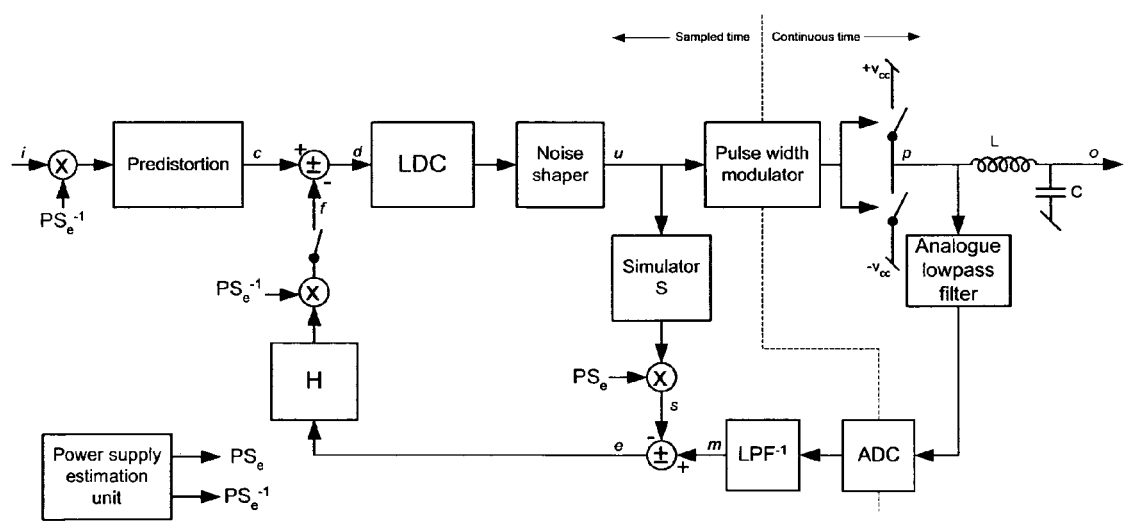
Figure 34: Amplifier with compensation for the effect of power supply variations.

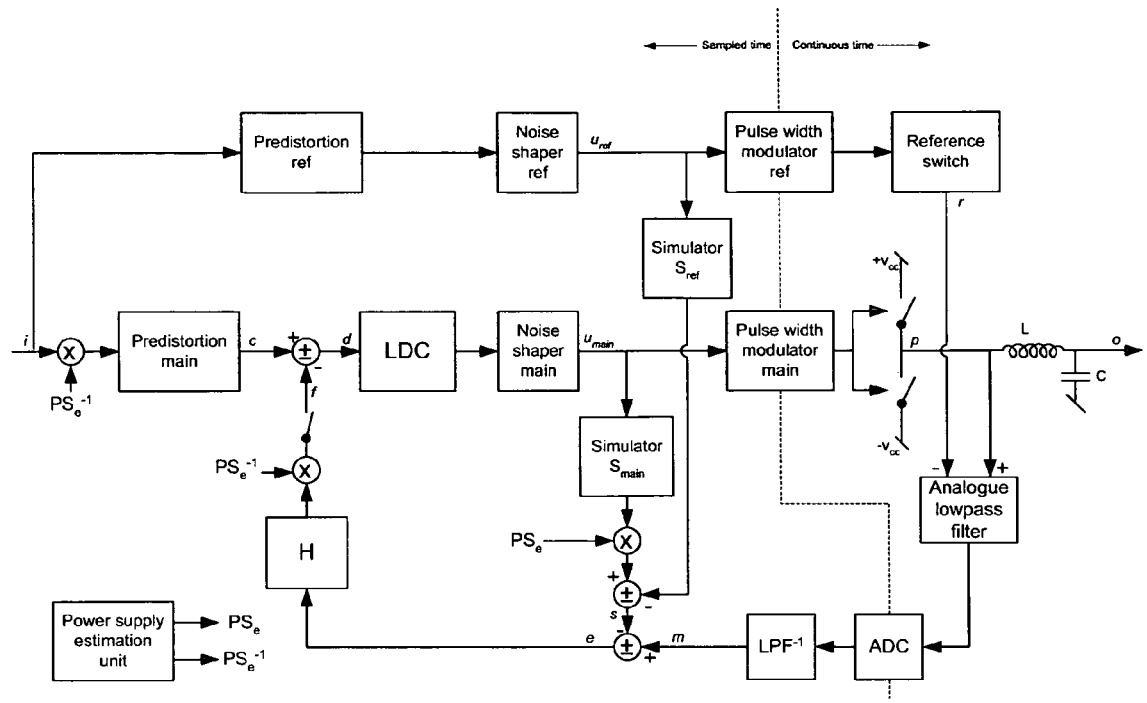
Figure 35: Amplifier with reference path.
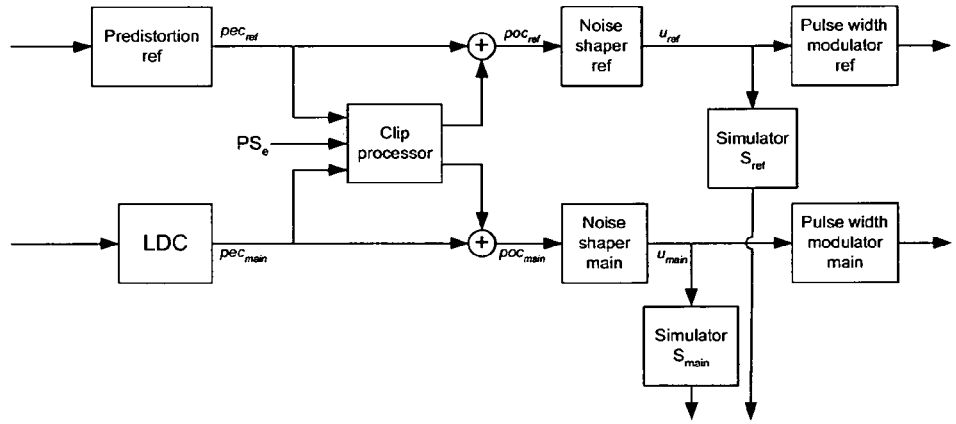
Figure 36: Joint clipping of the main and reference paths.

DIGITAL PWM AMPLIFIER WITH SIMULATION-BASED FEEDBACK

BACKGROUND

1. Field of the Invention

The invention relates generally to digital amplifiers, and more particularly to systems and methods for to performance improvements in a digital switching power amplifier by means of feedback.

2. Related Art

Practical audio power amplifiers using Pulse Width Modulation (PWM) have been known since the mid 1960s. In amplifiers from that era, a pulse train was generated by comparing a voltage representing the incoming audio signal with a reference waveform, typically a triangular wave or sawtooth wave, with a frequency in the range 50 kHz-200 kHz. The comparison yielded a 2-level rectangular wave having the same frequency as the reference waveform, and with a mark:space ratio varying in sympathy with the audio. The rectangular wave was amplified to the desired power level and then passively lowpass filtered to remove most of the high-frequency components of the rectangular wave, leaving its average level, which follows the audio, to drive a load such as a loudspeaker.

It is possible to obtain extremely good performance when such amplifiers are run 'open-loop', that is without feedback, but it is an expensive solution since the amplifier's performance is critically dependent on the quality of the output stages and the power supply. To alleviate these dependencies, the trend in the 1970s and subsequently has been to incorporate feedback. One simple way to incorporate feedback in an amplifier that compares the audio with a triangle wave, is to replace a fixed triangle wave by a sawtooth wave that is obtained by integrating the substantially rectangular wave that appears at the output of the amplifiers power switches realize. Analysis shows that this is an effective means of providing feedback. Moreover since the feedback is tightly integrated into the PWM itself, stability problems typically associated with feedback do not arise.

Amplifiers as described above have sometimes been called 'digital' in the popular press, but we shall describe them as 'analog', because the timings of the edges of the rectangular waves can vary continuously in sympathy with the audio. We shall reserve the word 'digital' for an amplifier in which the edge timings are quantized, so that the edge timings can be represented digitally and the edges can be generated by counting pulses produced by a high-precision, high-frequency clock, such as a crystal oscillator. This principle was proposed by Sandler [6], who also realized that the apparent need for a clock frequency in the gigahertz region could be avoided by the use of oversampling and noise shaping. Several commercial products are now available that use this principle (see, for example, [3].)

The digital principle brings precision to the generation of the PWM waveform, but the power amplification, typically accomplished by MOSFET (Metal Oxide Silicon Field Effect Transistors) power switches, remains a fundamentally analog process, and as such is vulnerable to non-ideal component behavior. There is a distortion associated with the switching called "dead-time distortion", and there is dependency on the power supply just as with the original analog PWM amplifiers. Without feedback or other compensation, the gain of the output stage will be directly proportional to the supply voltage. This precludes the use of an inexpensive non-regulated power supply in low-cost applications, or condemns the system to relatively poor performance.

Attempts have been made in the prior art to apply feedback to the output stages of a digital PWM amplifier. One such attempt is embodied in the PEDEC (PCT/DK98/00133) principle, in which a modulator operating at a relatively low level produces a PWM waveform, and a correction unit re-times the edges of the waveform before passing the waveform to the power switches. The correction unit receives control signals from an error processing unit, which compares the original low-level PWM waveform with the output of the power switches. The input to the power switches is thus modified in dependence on the output, creating a feedback loop.

The PEDEC principle can be applied to a digital or an analog PWM amplifier. However the feedback is analog and local to the output stages—the quality of the output is fundamentally determined by the quality (including jitter properties) of the low-level PWM waveform.

Another example of feedback in the prior art is the disclosure by Melanson in U.S. Pat. No. 6,373,334 "Real Time Correction of a Digital PWM Amplifier". Again, the feedback is derived by comparing a low-level square wave with the output of the power switches. In this proposal, however, the correction is fed back to the PWM modulator, so there do not exist two PWM waveforms, original and re-timed, as in the PEDEC proposal. U.S. Pat. No. 6,373,334 describes a feedback that is tightly integrated into a particular type of PWM modulator. It shares with PEDEC the property that the quality of the final output is limited by the quality of the low level PWM waveform.

In an analog (non-PWM) amplifier, it is customary to take at least some feedback from the final output to a point close to the input. A substantial reason why this is difficult in a digital PWM amplifier is loop delay. In particular, since the output is analog but the input and early processing are digital, an ADC (Analog to Digital Converter) is required in the feedback path. Depending on the topology, the quality of the final output will be directly related to the quality of the ADC. Currently available audio ADCs of sufficient quality, however, have delays that are completely excessive for inclusion in a loop that provides significant feedback over the audio range of 0-20 kHz.

Even when the ADC delay has been minimized, substantial stability problems remain. There is an extensive literature on stabilizing feedback loops, using Bode plots, lead/lag compensation, nested feedback and the like. Most of the techniques apply to linear systems with constant gain, and there is little guidance on how to deal with nonlinearity or gain variation apart from allowing an adequate "gain margin" or "phase margin".

Unfortunately, a loop that includes a delay of, for example, 10 µs, and that has enough "gain margin" or "phase margin" to be robust against nonlinearity and gain variation, is unlikely to provide a significant degree of feedback at 20 kHz. "Nested feedback" appears at first sight to be able to provide large amounts of feedback with stability. On examination, however, it is found that the stability is "conditional", which means that it is susceptible to gain variation, and oscillation can be caused even by a reduction of the gain of the forward path. Consequently, this technique would be completely unsuitable for use in a PWM amplifier that is required to work with an unregulated power supply.

A less obvious problem is the intrinsic nonlinearity introduced by the pulse width modulation process. This is normally thought of as a small effect that introduces harmonic distortion at high audio frequencies (e.g., −70 dB 3rd harmonic on a full scale 5 kHz fundamental [3].) However, design of a feedback loop requires one to consider frequencies well outside the band that is effectively controlled by feedback. In the case of a digital PWM amplifier with a sampling and switching frequency of 384 kHz, frequencies up to the Nyquist of 192 kHz should ideally be considered. At 192 kHz, the forward gain of a conventional double-edge PWM modulates by 100% as the mark:space ratio of the PWM waveform varies over its full range. Even at 80 kHz, the forward gain modulates by 20%. Such modulation of a part of the spectrum that is only two octaves above the top of the range that is desired to be controlled will set a limit to how "aggressive" any conditionally stable feedback can be, even for amplifiers that are always used with stabilized power supplies.

Several correction methods are known for PWM nonlinearity. One straightforward method, as shown in [3], achieves almost complete cancellation of the nonlinear effect within the audio band. However if it is hoped that feedback stability will be improved by correcting the PWM nonlinearity, then the corrector must be placed inside the feedback loop. Since the corrector in [3] has a delay of one sample (e.g. 2.6 μs) the stability problem is already worse. Further, while the correction is almost perfect within the audio band, it still does not provide consistent performance near the Nyquist frequency, for it is not possible to compensate a gain modulation of 100%.

In view of the difficulties discussed above, there is a need for a robust method for applying feedback to a digital PWM amplifier that directly addresses the issues of loop delay, nonlinearity and variation in the forward gain.

SUMMARY OF THE INVENTION

This disclosure is directed to systems and methods for performance improvements in a digital switching power amplifier by means of feedback. In the various embodiments of the present invention, the processing performed by a signal processing plant in a digital pulse width modulation (PWM) amplifier is simulated, and the simulation is used as the basis for feedback around the plant.

In an exemplary embodiment, a digital pulse width modulation (PWM) amplifier includes a signal processing plant configured to receive and process an input audio signal. The amplifier also includes a simulator configured to model processing of audio signals by the plant. The outputs of the plant and the simulator are provided to a subtractor, the output of which is then added to the input audio signal as feedback. In various embodiments, the plant may consist of a modulator and power switch, a noise shaper, or any other type of plant. If the input of the plant is digital and the output is analog, an analog-to-digital converter (ADC) may be provided to convert the output audio signal to a digital signal for input to the subtractor. Filtering may be implemented before or after the ADC, and a decimator may be placed after the ADC if it is an oversampling ADC. The simulator may perform linear or nonlinear processing on the audio signal or may introduce delays into the signal as needed to simulate the plant.

In one embodiment, a switching amplifier employing a digital pulse width modulator and power switches that feed an output, is provided with a simulator that models the behavior of the modulator and/or of the power switches, and with a subtractor that derives an error signal in dependence on the difference between the output of the simulator and the output of the power switches. The input to the pulse width modulator is modified by a feedback signal derived in dependence on the error signal.

In one embodiment, the simulator will be digital and will model the nonlinearity introduced by the modulator.

In one embodiment, the simulator will model any delay introduced by the pulse width modulator or by the power switches and their drivers, or by an ADC or other circuitry that is used to process the output of the power switches prior to the subtractor.

In one embodiment, the error signal is filtered by a substantially minimum-phase filter whose response rises above an operating frequency range, in order to provide phase advance that compensates some of the said delay.

In one embodiment, the amplifier contains calibration and adjustment units that act to minimize the error signal. Preferably, gain differences between the two inputs to the subtractor will be compensated, and typically this is done by adjusting the gain of the simulator or in the feedback path. In some embodiments, delay differences between the two paths will also be monitored and compensated. Typically, the calibration unit receives the error signal, detects any correlation between the error signal and the input to the feedback loop, and requests and adjustment that will reduce that correlation.

In one embodiment, the feedback loop includes a low-delay corrector that substantially corrects, over an operating frequency range, the nonlinearity of the pulse width modulator. Typically, the low-delay corrector has a small-signal transfer function that is minimum phase. Preferably also, the amplifier includes, prior to the main feedback loop, a predistortion unit that substantially compensates the nonlinear effects of the pulse width modulator that have not been compensated by the low-delay corrector. In some embodiments, the input to the predistortion unit is modified by low frequency components of the feedback signal.

In another embodiment, a switching amplifier is provided with a feedback path that includes an ADC whose input is responsive to the difference between a signal derived from a low-level PWM waveform and a signal derived from the output of power switches. Typically, the ADC is of an oversampling type, is preceded by an analog lowpass filter and is followed by a decimator. Typically, the feedback path includes a digital shaping filter whose response rises above the operating frequency range in order to compensate, within the operating frequency range, delays in the feedback loop. Typically, the feedback loop includes also a low-delay corrector that provides approximate or substantial correction, over the operating frequency range, for the nonlinear behavior of a pulse width modulator.

In another embodiment, a switching amplifier is provided with a feedback path comprising an oversampling ADC followed by a decimation filter and decimator producing a decimated output. The decimation filter is substantially minimum phase and has an amplitude response that is tailored to provide, at each frequency above the Nyquist frequency of the decimated output, substantially the minimum attenuation required in order to reduce the aliased image of that frequency to an acceptable level. Typically, the decimator filter is an FIR filter some of whose zeroes are not configured to provide maximum attenuation at the sampling frequency of the decimated output or its harmonics.

Numerous other embodiments are also possible.

BRIEF DESCRIPTION OF THE DRAWINGS

Other objects and advantages of the invention may become apparent upon reading the following detailed description and upon reference to the accompanying drawings.

FIG. 1 is a digital pulse width modulated amplifier in accordance with the prior art.

FIG. 2 is a diagram illustrating small signal amplitude response of double edge (class AD or class BD) PWM modulator operating at 384 kHz, with pulse width, as a percentage of the pulse repetition period, as parameter.

FIG. 3 is a diagram illustrating a digital pulse width modulated amplifier including feedback according to one embodiment of the invention.

FIG. 4 is a diagram illustrating the internal structure of an oversampling ADC in one embodiment.

FIG. 5 is a diagram illustrating coefficients tap[0] through tap[79] of an 80-tap FIR decimation filter in one embodiment.

FIG. 6 is a diagram illustrating the amplitude response of an 80-tap FIR decimation filter in one embodiment.

FIG. 7 is a diagram illustrating the amplitude response of an 80-tap FIR decimation filter and (dashed) cascade of four combs in one embodiment.

FIG. 8 is a diagram illustrating the alias attenuation of an 80-tap FIR decimation filter and (dashed) cascade of four combs in one embodiment.

FIG. 9 is a diagram illustrating z-plane zeroes of a comb filter with eight equal taps in one embodiment.

FIG. 10 is a diagram illustrating z-plane zeroes of an 80-tap FIR decimation filter in one embodiment.

FIG. 11 is a diagram illustrating a close-up of five z-plane zeroes of an 80-tap FIR decimation filter near to $z=0+1i$ in one embodiment.

FIG. 12 is a diagram illustrating a measurement path in one embodiment.

FIG. 13 is a diagram illustrating a low-frequency model of PWM nonlinearity in one embodiment.

FIG. 14 is a diagram illustrating the response of an analog lowpass filter to a PWM pulse in one embodiment.

FIG. 15 is a diagram illustrating the sharpening of an analog filter response using a 3-point deconvolution filter in one embodiment.

FIG. 16 is a diagram illustrating the response of an 80-tap FIR decimation filter to sharpen analog filter response in one embodiment.

FIG. 17 is a diagram illustrating a conceptual model of a measurement path in one embodiment.

FIG. 18 is a diagram illustrating a practical simulator architecture in one embodiment.

FIG. 19 is a diagram illustrating detail of an amplifier incorporating an alternative simulator in one embodiment.

FIG. 20 is a diagram illustrating the amplitude response of a prediction filter H' in one embodiment.

FIG. 21 is a diagram illustrating coefficients H[0] through H[24] of feedback filter H, implemented as 25-tap FIR in one embodiment.

FIG. 22 is a diagram illustrating the amplitude response of the feedback filter H of FIG. 21.

FIG. 23 is a diagram illustrating the magnitude of gain of feedback loop with the simulator disabled in accordance with one embodiment.

FIG. 24 is a diagram illustrating the magnitude of the noise transfer function (NTF) of a feedback loop in one embodiment.

FIG. 25 is a diagram illustrating a low delay corrector unit LDC in one embodiment.

FIG. 26 is a diagram illustrating the small-signal amplitude response of the low delay corrector unit of FIG. 25, with pulse width as a parameter.

FIG. 27 is a diagram illustrating a Gerzon first-order predistortion applied to nonlinear element N that approximates delay □ in one embodiment.

FIG. 28 is a diagram illustrating a Gerzon predistortion unit adapted to compensate LDC and S in one embodiment.

FIG. 29 is a diagram illustrating a Gerzon predistortion unit incorporating correction for small-signal transfer function in one embodiment.

FIG. 30 is a diagram illustrating a Gerzon predistortion unit adapted to compensate LDC and pulse width modulator in one embodiment.

FIG. 31 is a diagram illustrating a Gerzon predistortion unit adapted to compensate a pulse width modulator, followed by a compensator for LDC in one embodiment.

FIG. 32 is a diagram illustrating the detail of a predistortion unit using the principle of FIG. 31.

FIG. 33 is a diagram illustrating the detail of a predistortion unit using the principle of FIG. 30.

FIG. 34 is a diagram illustrating an amplifier with compensation for the effect of power supply variations in one embodiment.

FIG. 35 is a diagram illustrating an amplifier with reference path in one embodiment.

FIG. 36 is a diagram illustrating joint clipping of the main and reference paths in one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for systems and methods for performance improvements in a digital switching power amplifier by means of simulation-based feedback.

In one embodiment, a digital pulse width modulation (PWM) amplifier includes a signal processing plant configured to receive and process an input audio signal. The amplifier also includes a simulator configured to model processing of audio signals by the plant. The outputs of the plant and the simulator are provided to a subtractor, the output of which is then added to the input audio signal as feedback. In various embodiments, the plant may consist of a modulator and power switch, a noise shaper, or any other type of plant. If the input of the plant is digital and the output is analog, an analog-to-digital converter (ADC) may be provided to convert the output audio signal to a digital signal for input to the subtractor. Filtering may be implemented before or after the ADC, and a decimator may be placed after the ADC if it is an oversampling ADC. The simulator may perform linear or nonlinear processing on the audio signal or may introduce delays into the signal as needed to simulate the plant.

FIG. 1 shows a typical prior art digital power amplifier employing Pulse Width Modulation, as described more fully in [3]. In FIG. 1, a pulse-width modulator furnishes a square wave of variable mark:space ratio, alternatively described as a sequence of pulses of variable width. In the case illustrated, known as "symmetrical class AD modulation", the rising and falling edges of the pulse are moved in opposite directions in response to the input to the modulator, as indicated by the arrows in FIG. 1. The modulated pulse sequence is fed to a driver stage (not shown) and then to power switches, typically MOSFETS. In a typical implementation, two MOSFETS will be driven in antiphase so that their junction is connected alternately to the power rails +Vcc and −Vcc and thereby carries a high level PWM waveform whose mark:space ratio is modulated by the signal.

FIG. 1 shows a typical prior art digital power amplifier employing Pulse Width Modulation, as described more fully in 3. In FIG. 1, a pulse-width modulator furnishes a square wave of variable mark:space ratio, alternatively described as a sequence of pulses of variable width. In the case illustrated, known as "symmetrical class AD modulation", the rising and falling edges of the pulse are moved in opposite directions in response to the input to the modulator, as indicated by the arrows in FIG. 1. The modulated pulse sequence is fed to a driver stage (not shown) and then to power switches, typically MOSFETS. In a typical implementation, two MOSFETS will be driven in antiphase so that their junction is connected alternately to the power rails +$V_{cc}$ and −$V_{cc}$ and thereby carries a high level PWM waveform whose mark:space ratio is modulated by the signal.

An LC filter is provided both for efficiency reasons and to remove the square wave from the final output. The filtered analog output then follows, approximately, the input to the modulator, and can be used to drive a load such as a loudspeaker.

Several variants of the topology of FIG. 1 are known in the prior art, including use of four switches in a full "H-bridge" rather than two in a half-bridge as shown.

The input to the modulator is digital. In "symmetrical class AD" modulation, each digital sample controls the timings of both edges of a pulse. There are also "leading edge" and "trailing edge" modulation schemes in which just one pulse edge is modulated, and also "consecutive edge modulation" in which, for example, even-numbered input samples control the rising edges and odd-numbered samples control the falling edges of the pulses. Thus, with consecutive edge modulation (and also with "class BD modulation", also known as "three-level modulation") the digital sampling frequency is twice the power switching frequency, whereas with the other modulation schemes mentioned above, the two frequencies are the same.

Alternative modulation schemes and power switch topologies will not be discussed further, but it is to be understood that the invention is not restricted to symmetrical class AD modulation, nor is it restricted to the half-bridge power switch topology.

A typical sampling frequency for the input to the modulator is 384 kHz. An amplifier receiving a digital input a standard consumer sampling frequency between 44.1 kHz and 192 kHz will therefore require an upsampler, not shown in FIG. 1.

A digital pulse width modulator determines the timings of the edge transitions of the PWM waveform by counting the beats of a digital oscillator or clock. The maximum clock frequency that is practical with current technology is of order 300 MHz, which implies that there are fewer than 1000 distinct pulse lengths possible, or fewer than 500 if symmetrical class AD modulation is used. Used directly, this gives digital resolution lower than that of 9-bit PCM, or a noise floor worse than −66 dB over the conventional audio frequency range 0-20 kHz, or −56 dB as seen over the Nyquist range 0-192 kHz. The purpose of the noise shaper in FIG. 1 is to requantize the incoming digital audio signal having a wordwidth typically between 16 and 28 bits, down to a wordwidth of typically 9 bits or fewer, with a noise level somewhere between −100 dB and −135 dB over 0-20 kHz. However, the noise shaping increases the noise as seen wideband 0-192 kHz by typically up to 12 dB, and it is to be noted that wideband noise at −44 dB reduces significantly the headroom for signal excursion before clipping.

Digital pulse width modulation is inherently nonlinear. The nonlinearity has a precisely known mathematical form and can be corrected to high accuracy, within the audio range, by a predistortion unit as shown in FIG. 1 and discussed in 3. Such correction by predistortion can be extremely effective, but there remain other problems that cannot be characterized so accurately in advance, and therefore are not as amenable to correction by predistortion. These problems include distortion effects such as "dead time distortion" associated with the power switches, and modulation of the audio by the power supply. It will be appreciated that the modulator merely varies the proportion of time that the junction between the two switches spends at +$V_{cc}$ and −$V_{cc}$, so the amplitude of the filtered output waveform will be proportional to the difference (+$V_{cc}$)−(−$V_{cc}$).

In a typical analog PWM amplifier, these problems are substantially reduced by overall feedback, but substantial problems confront the person who would think to place most or all of the elements shown in FIG. 1 within a feedback loop. Firstly, the power switch output is analog while the signal at the input to the modulator and at earlier points in the chain is digital, so an ADC (analog-to-digital converter) will be needed. It is desired to keep delay to a few microseconds so a special type of ADC is needed.

Even with a specially designed fast ADC, it is still difficult to achieve a loop delay lower than 5 μs-10 μs. A delay of 10 μs corresponds to a phase shift of 72° at 20 kHz, and to obtain substantial feedback over 0-20 kHz using prior art methods, one would be forced to consider a "conditionally stable" design. In such a design, the phase is allowed to exceed 180° at some frequencies at which the (modulus of) loop gain is greater than unity, but the phase must be brought down to less than 180° when the loop gain makes the transition from being greater than unity to being less than unity.

If overload considerations can be handled, a conditionally stable feedback loop can be satisfactory in the context of a linear, or almost linear, system. However, the pulse width modulation process is nonlinear. In the case of double-edge modulation the transfer function is flat in the limit as the pulse length tends to zero, but shows an increasing high frequency droop as the pulse length increases, as shown in FIG. 2. The amplitude response at the Nyquist frequency (192 kHz in the case illustrated) tends to zero as the pulse length tends to 100% of the pulse repetition period. This implies that a conditionally stable feedback loop that is stable at zero pulse length is likely to have stability problems as pulse length increases.

In the PEDEC and Melanson prior art already cited, these difficulties are avoided by applying the feedback to the power switches only, and in the case of PEDEC by keeping the feedback in the analog domain so that ADC delay is avoided completely.

Embodiments of the present invention address the questions of how to minimize the delay introduced by a high-quality audio ADC, and how to keep a digital feedback loop stable despite the remaining delay and the PWM nonlinearity.

Amplifier Topology

An exemplary embodiment of the invention will now be described with reference to FIG. 3. Signals to the left of the dashed line in FIG. 3 are digital, while those to the right are analog. The PWM modulator and the ADC are the interface between the two domains. The noise shaper, pulse width modulator, power switches and LC filter in FIG. 3 perform the same function as the corresponding items in FIG. 1.

In order to provide feedback in FIG. 3, the power switch output is filtered by an analog low pass filter and converted to digital form by the ADC. The unit $LPF^{-1}$ provides partial correction for the effect of the analog lowpass filter. A subtraction node then subtracts from the feedback a comparison signal calculated by the simulator S, and the difference is fed through a shaping filter H and applied, via a switch that can be used to enable or disable the feedback, to the main signal path. The low delay corrector LDC provides partial correction for PWM nonlinearity. The predistortion unit provides further correction of PWM nonlinearity. These components will now be explained in more detail.

Lowpass Filtering, Sampling and ADC

The output from the power switches has sharp edges because of the PWM waveform, and it contains high levels of the switching frequency and its harmonics.

In making the transition from the continuous-time domain to the discrete-time domain, the ADC will perform a sampling operation, and a low pass filtering is needed to prevent the switching frequency and its harmonics from aliasing with the sampling process and corrupting the digital representation of the output audio signal. This filtering needs to be considered carefully in relation to the sampling frequencies involved and the delay introduced.

Currently, the preferred type of ADC converter for high quality audio is the high-oversampling type, in which a modulator produces a digital output at, for example, 6 MHz or 12 MHz, which is then decimated to an audio sampling frequency of typically between 44.1 kHz and 192 kHz. Typically, the decimation takes place in two or more stages, the first stage of decimation producing an output at typically four times the final output rate (c.f. section 1.3.2 of 7.) A frequency of 384 kHz would not be unreasonable for the output of the first stage of decimation, which means that the second stage can be dispensed with, which is highly convenient, as it introduces delay.

FIG. 4 shows a preferred form of ADC which consists of an ADC modulator operating at a frequency $fs_{ADC}$, for example 6.144 Mhz, followed by a single stage of decimation to produce an output at $fs_{PWM}$, for example 384 kHz. The remainder of the digital circuitry in FIG. 3 also operates at $fs_{PWM}$, and this is also the PWM switching frequency if class AD modulation is used.

The PWM output waveform contains the switching frequency and harmonic components having very substantial amplitudes. The fundamental and the harmonics are all modulated nonlinearly by the input to the PWM modulator. The higher order is the harmonic, the more nonlinear is its modulation. If the nonlinearly modulated harmonics are aliased down to the audio band, they will introduce audio distortion into the feedback chain and hence add distortion to the reproduced audio. If audiophile-grade distortion figures are to be obtained, each frequency that might alias into the audio band must be attenuated by about 100 dB.

The two processes that might cause aliasing are the sampling at $fs_{ADC}$, and the decimation from $fs_{ADC}$ to $fs_{PWM}$. These processes alias frequency components close to $fs_{ADC}$ and $fs_{PWM}$ respectively, and components close to their respective harmonics, into the audio frequency band. It is the job of the analog lowpass filter in FIG. 3 to ensure that components near $fs_{ADC}$ and its harmonics are sufficiently attenuated, while it is the job of the decimation filter in FIG. 4 to ensure that the components near $fs_{PWM}$ and its harmonics are sufficiently attenuated.

In the case that $fs_{ADC}$ is about 6 MHz, a second order lowpass filter having two poles at 40 kHz (4 µs) will provide attenuation of about 87 dB at $fs_{ADC}$. A third order filter having three nonresonant poles at 200 kHz (0.8 µs) would provide very similar attenuation at $fs_{ADC}$, and would probably be preferable, but for simplicity we shall base much of what follows on the assumption of a second order filter.

The lowpass filter introduces significant or substantial delay, but if it is a minimum-phase filter, most of the delay can be compensated digitally, either in the correction unit $LPF^{-1}$ or later in the signal chain if $LPF^{-1}$ is not present. For example, two poles of 4 µs each will apparently produce a group delay of 8 µs near DC, but if the filter $LPF^{-1}$ is given the response:

$$LPF^{-1} = 4.36757 - 4.55540 \cdot z^{-1} + 1.18783 \cdot z^{-2}$$

at a sampling frequency of 384 kHz, as will be discussed later, then 5.6764 µs of delay is recovered, reducing the net delay to 2.3236 µs, or 0.89 samples.

Decimation Filter

In a commercial high-oversampling ADC, it is almost universal practice to perform the first stage of decimation using a cascade of "comb" filters, each of which has a frequency response:

$$\frac{\sin\left(\frac{\pi f}{fs}\right)}{N \sin\left(\frac{\pi f}{Nfs}\right)} \qquad \text{Equation 1}$$

where f is frequency, $fs = fs_{PWM}$ is the output sampling frequency and N is the decimation ratio $fs_{ADC}/fs_{PWM}$. Comb filters have a particularly simple implementation (c.f. section 1.3.3 of 7.)

The single comb filter provides infinite attenuation of $fs_{PWM}$ and its harmonics, but considering distortion at 20 kHz, the critical factor is the attenuation of components 20 kHz away from a harmonc. With $fs_{PWM} = 384$ kHz and N=16, the attenuation at (384 kHz−20 kHz)=364 kHz relative to the response at 20 kHz is 25.15 dB. Hence a cascade of four comb filters is required if an attenuation of about 100 dB is required.

The group delay of a single comb filter is just under half a sample period at the output rate. More precisely, it is $(N-1)/(2 \times N)$ periods=0.46875 periods when N=16. Four combs produce a delay of $2 \times (N-1)/N$ periods=1.875 periods, or 4.88 µs when fs=384 kHz.

This delay is accompanied by an amplitude droop of 15.63 dB at the Nyquist frequency of 192 kHz. An amplitude droop can be corrected by subsequent filtering at the decimated rate, and if this is done using a minimum-phase filter, the group delay at DC is reduced.

In detail, from result (a) in group I of the "Tabulation of Relations Between Real and Imaginary Components of Network Functions", on page 334 of the 1975 edition of 2, we can deduce that the group delay near DC of a discrete-time minimum-phase filter is:

$$delay_{DC} = \frac{1}{fs^2} \int_0^{\frac{fs}{2}} \frac{\ln\left(\frac{G(0)}{G(f)}\right)}{\sin\left(\frac{\pi f}{fs}\right)^2} df \qquad \text{Equation 2}$$

where $G(f)$ is the amplitude gain of the filter. We shall refer to this equation as the "Bode formula".

In the case of a droop correction filter, the gain $G(f)$ is generally higher than the DC gain $G(0)$, so the logarithm is negative and the group delay will also be negative, i.e. the filter produces a phase advance.

The correction filter required to correct a comb droop is:

$$G(f) = \frac{N \sin\left(\frac{\pi f}{N fs}\right)}{\sin\left(\frac{\pi f}{fs}\right)}$$

Inserting this $G(f)$ in the Bode formula with N=16, we find a negative delay: −0.11998 sample periods. Adding the comb delay of 0.46875 periods we find a net delay of 0.34877 periods.

A cascade of four combs with amplitude droop corrected will therefore produce a delay of 4×0.34877=1.39507 periods or 3.633 μs at $fs_{PWM}$=384 kHz. This delay is significant or dominant in the context of the feedback loop.

We now consider the design of a decimation filter with minimal delay. The purpose of the filter is to attenuate the frequencies that would otherwise cause aliased images. A minimum-phase filter will provide a specified attenuation with minimal delay. In the Bode formula (Equation 2,) the term $G(0)/G(f)$ is the attenuation relative to DC, expressed as an amplitude ratio. Increasing the attenuation at any frequency other than DC will increase the delay, and attenuation at lower frequencies is more important than that at higher frequencies because of the term $$\sin\left(\frac{\pi f}{fs}\right)^2$$

in the denominator. Therefore, the decimation filter should not have more attenuation than is needed at any given frequency.

The frequencies where attenuation is required most critically are those that would alias into the audio band, which is conventionally taken as 0-20 kHz. Thus in the case considered above, high attenuation is required over the critical frequency ranges 364 kHz-404 kHz, 748 kHz-788 kHz, etc. The decimator will alias signal components outside these ranges so that they appear as ultrasonic components in the feedback path, from where they are injected into the forward path. The decimation filter therefore needs to be designed with some regard to its response outside the critical frequency ranges, in order to limit the total ultrasonic energy injected into the in the main signal path. Nevertheless, its response can be allowed to rise very substantially outside the critical ranges.

FIG. 5 shows the coefficients of an 80-tap FIR decimation filter designed according to these principles, and FIG. 6 shows the attenuation it gives, plotted over the full Nyquist range from 0 to $fs_{ADC}/2$, which is 3.072 MHz in the case considered. This filter was designed using a simple linear least-squares procedure. A penalty function was constructed giving a very high weight to the mean-square response in the critical frequency ranges and a moderate weight to the mean-square response elsewhere. The first tap was constrained to be unity, and the remaining 79 taps were chosen by least squares to minimize the penalty function. Then the filter was renormalized to give unity response at DC. It was found empirically that a filter with fewer than 80 taps failed to provide adequate attenuation over the critical frequency ranges. Longer filters are in principle better, resulting in the attenuation reducing more rapidly away from the frequency ranges where it is needed, but the improvement in overall system performance is small.

FIG. 7 is a comparison between this 80-tap FIR filter and the cascade of four combs described earlier. Both filters provide at least the desired 100 dB of attenuation over the critical frequency ranges, but the comb filter provides unnecessarily large attenuation at some frequencies outside these ranges, and also unnecessarily large attenuation at the exact multiples of the switching frequency.

Neither filter is completely flat over the output Nyquist frequency range 0-192 kHz. It is wasteful to try to achieve flatness over this range in a filter that operates at 6.144 MHz, since a similar result could be achieved more economically by a postprocessing with a flattening filter running at the output rate of 384 kHz. In the context of the amplifier, such flattening is folded with other filtering, but for the purpose of comparison we temporarily suppose that the each decimation filter will have its response 0-192 kHz flattened by a dedicated filter. It will be apparent that the alias performance is not affected by such a filter, as raising the response at, say, 50 kHz, will increase the desired signal and the alias products that fall at 50 kHz in the same ratio. It would be equivalent to pre-filtering (i.e. before the decimator) so as to raise the response both at 50 kHz and at all the frequencies 384 kHz±50 kHz, 768 kHz±50 kHz etc. that will alias to 50 kHz. Closer examination shows that this equivalence applies not only to the alias performance but also to the total delay.

Therefore, a valid way to characterize a decimation filter is to plot the ratio of its response at a frequency to its response at the image of that frequency in the output Nyquist range. This gives the response on the assumption that the output Nyquist range has been flattened by one of the two equivalent means described above.

The 80-tap FIR filter and the four cascaded combs are compared on this basis in FIG. 8. The curve shapes are now different but once again the cascaded combs are seen to provide substantial unnecessary attenuation.

From the coefficients in FIG. 5, the group delay at DC of the 80-tap FIR filter is easily computed as 12.94 sample periods at the input rate or 0.809 periods at the output rate of 384 kHz. A flattening filter implemented at fs=384 kHz that flattens the response over 0-192 kHz has a group delay of −0.1869 sample periods. The group delay of the flattened filter is therefore 0.809+(−0.1869)=0.6221 periods. This is to be compared with the corresponding figure of 1.39507 periods that was obtained for the cascade of four combs. The 80-tap FIR filter thus has a delay advantage of greater than a factor two in this instance.

The delay advantage of the FIR filter would have been less if, in the least-squares procedure described above, the weight given to the response outside the critical regions had been reduced. Noise generated by the ADC is the principal factor determining the how much attenuation is needed outside the critical regions. This will be different from one ADC to another: also it is frequency-dependent so the least-squares weighting should also be frequency-dependent outside the critical region. Weighting within the critical regions should model the sensitivity to aliased sidebands of the switching frequency's harmonics. This will depend on the transfer function of the analog lowpass filter. When all these considerations have been taken into account, the resulting FIR decimation filter may have a greater delay than the one illustrated. Nevertheless the superiority over cascaded combs is likely to remain.

A distinction between the prior-art comb filter and the decimation filter disclosed herein is illustrated in FIG. 9 and FIG. 10. FIG. 9 shows the z-plane transfer function zeroes of a single comb according to equation 1 with N=16. There are fifteen zeroes, equally spaced on the unit circle except for the absence of a zero at z=1+0i. Each zero is at a frequency corresponding to the sampling frequency $fs=fs_{PWM}$ or a harmonic thereof. In a cascade of four combs, each zero in FIG. 9 becomes a quadruple zero, so again all zeroes are on the unit circle and are at the sampling frequency or a harmonic.

FIG. 10 shows the z-plane transfer function zeroes of the 80-tap FIR decimation filter described above. It will be seen that most of the zeroes are still close to the unit circle, but there is some spreading along the circle in order to give more uniform attenuation over each critical range. Further detail of the cluster of five zeroes close to z=0+1i is shown in FIG. 11. It is preferable that all zeroes should lie inside the unit circle as shown, but this may not be achieved in practice because of coefficient rounding errors.

Feedback Stabilization Using a Simulator

As already explained above, power supply variation and PWM nonlinearity pose significant stability problems to a feedback loop designed using prior art methods. The present amplifier provides, as shown in FIG. 3, a simulator S that models known aspects of the pulse width modulator and power switch response. An error signal e is then derived by subtracting the simulator output from the output of the $LPF^{-1}$ correction filter, or alternatively from the ADC output if the $LPF^{-1}$ correction unit is not present.

There are thus two paths from the output u of the noise shaper to the subtractor. The first path is via the simulator S, while the second is via the pulse width modulator, the output switches, the analog lowpass filter, the ADC and $LPF^{-1}$. This second path will be referred to herein as the measurement path, and for future reference we display the measurement path in FIG. 12.

The simulator S is intended to model the measurement path. If the modelling were perfect, the two paths would balance and the error signal e would be zero. This is the principle of the feedback stabilisation—if the error signal is zero, there is no feedback and there can be no oscillation. In practice, the modelling is not perfect. Nevertheless, the tendency to oscillation can be suppressed very considerably. For example, supposing that each path had a small-signal gain of approximately unity but that, at some frequency, there was a 5% difference between the gains of the two paths, then the gain from point u to point e in FIG. 3 would be approximately 0.05. Considering now the path from e back to u, the noise shaper can be assumed to have a gain of unity; the gain of LDC can be bounded by a number such as 1.7 (c.f. FIG. 26), so the shaping filter H would need to have a gain of 1/(0.05×1.7)=11.8 approximately for the gain round the loop to exceed unity and hence for an oscillation to be self-sustaining. In practice, a very useful improvement in performance can be obtained while restricting H to have a gain very much less than this.

Ideally, the simulator should model both the linear response and substantial nonlinear aspects of the measurement path. The modelling is required to be reasonably accurate over the full Nyquist range 0 to $fs_{PWM}/2$, and over this range the PWM nonlinearity produced by the modulator is very significant, as has been discussed with reference to FIG. 2.

PWM nonlinearity has a precisely known mathematical form that has been extensively discussed in the literature (4, 5). FIG. 13 shows a simple model of PWM nonlinearity, modelling a symmetrical double-edge modulator. The input x represents pulse length as a proportion of the PWM switching period. In class AD modulation, x ranges from 0 to 1, while in class BD modulation, x ranges from −1 to +1. The model passes the signal with a delay of one sample, and in addition generates a cubic nonlinearity followed by a digital approximation to a double differentiation. Except for delay, this model is accurate in the audio range and could reasonably used as the basis for the simulator S if followed by linear filtering to model the linear response of the measurement path. The model of FIG. 13 becomes increasingly inaccurate with increasing frequency, but this may not matter if the feedback loop is not active up to the Nyquist frequency.

Derivation of Low-rate Simulator

The simulator of FIG. 13 is generic in that it does not presuppose the use of any particular type of ADC. We now describe a modelling procedure for use with an oversampling ADC, whereby the resulting simulator accurately models not just the PWM modulator, but also the remaining components in the measurement path.

In FIG. 14 the horizontal axis represents time in units of the period of an oversampling ADC clock, running at, for example, 6.144 MHz. We assume a PWM switching frequency of 384 kHz, and the time axis is conceptually divided into frames each containing one PWM pulse and in this case of length 16 beats of the ADC clock, as shown by the vertical lines. The first frame runs from t=0 to t=16, and the dashed line shows a PWM pulse placed centrally within that frame, of length 8 beats, i.e. with x=0.5, where x is the pulse length as a proportion of the PWM switching period. The solid line is the response to that pulse of a second-order all-pole analog lowpass filter having two nonresonant poles of 4 μs each (hence approximately −6 dB at 40 kHz). This filter response can be calculated, for any value of x, using standard Laplace transform techniques.

The dashed lines in FIG. 15 represent three Dirac pulses at t=0, t=16 and t=32 of areas 4.36757, −4.55540 and 1.18783 respectively. If the solid curve in FIG. 14 is convolved with this pulse sequence, the solid curve of FIG. 15 results. The three pulse areas sum to unity, and their heights are calculated by pole-zero matching so that the convolved impulse response is finite: with x=0.5 the solid curve in FIG. 15 is zero for t≧44; with x=1 the PWM pulse would be four units longer in each direction and the convolved impulse response would extend in time from t=0 to t=48.

If the convolved response of FIG. 15 is further convolved with the decimation filter of FIG. 5, the response shown in FIG. 16 results. This is zero from t=123 onwards, or with x=1 it would be nonzero over the range 0<t<127. We will denote this response by d(x, t).

If we now sample d(x, t) at t=0, 16, 32, ..., we will obtain the sampled sequence:

0, d(x, 16), d(x, 32), d(x, 48), d(x, 64), d(x, 80), d(x, 96), d(x, 112), 0, 0 ...

sampled at the PWM switching frequency of 384 kHz.

We now itemize the processing steps described above. In order, they are:
 convolution with lowpass filter
 convolution with three-pulse sequence
 convolution with decimation filter
 sampling at $fs_{PWM}$ The three convolutions are conceptually continuous-time convolutions, the decimation filter being regarded as a sequence of Dirac delta functions for this purpose. The person skilled in the art will appreciate that the above steps are equivalent to the following:
 convolution with lowpass filter
 sampling at $fs_{ADC}$
 sampled convolution with decimation filter
 decimation from $fs_{ADC}$ to $fs_{PWM}$
 sampled convolution with three-pulse sequence wherein the decimation filter and the three-pulse sequence are now conventional FIR digital filters This processing sequence can be identified with the processing shown in FIG. 12, if LPF$^{-1}$ in FIG. 12 is an FIR filter that performs the convolution of the three-pulse sequence:

$$LPF^{-1} = 4.36757 - 4.55540 \cdot z^{-1} + 1.18783 \cdot z^{-2}$$

In making this identification, we assume that the ADC modulator passes input to its output without change. We also assume that the effect of the power switch is to give each PWM pulse a height proportional to the power supply voltage $V_{cc}$, this being assumed not to change during the pulse.

It follows that the processing of FIG. 12 transforms an input value x into an output pulse sequence 0, d(x, 16)×$V_{cc}$, d(x, 32)×$V_{cc}$, ..., d(x, 112)×$V_{cc}$, 0, 0 .... All processing after the pulse width modulator is linear, so superposition applies and it follows that the measurement path of FIG. 12 can be modeled by the architecture of FIG. 17, in which each of the d(x, 16), d(x, 32) etc. is represented by a nonlinear function generator with input x.

To produce a practical simulator, we approximate each the nonlinear function by a polynomial in x. For the case discussed above, each function d(x, .) was evaluated at thirty values of x (x=$\frac{1}{32}$, $\frac{2}{32}$, ..., $\frac{30}{32}$) and the following coefficients obtained by a linear least-squares procedure:

$d(x, 16) = 0.0819616x + 0.0408626x^3 + 0.0011542x^5$ $d(x, 32) = 0.8066498x - 0.0849205x^3 - 0.0056800x^5$ $d(x, 48) = 0.0438820x + 0.0533158x^3 + 0.0114638x^5$ $d(x, 64) = 0.0784520x - 0.0229539x^3 - 0.0122444x^5$ $d(x, 80) = -0.1146495x + 0.0269429x^3 + 0.0073815x^5$ $d(x, 96) = 0.0921093x - 0.0188471x^3 - 0.0024272x^5$ $d(x, 112) = 0.0115946x + 0.0056019x^3 + 0.0003500x^5$ wherein the approximation error is typically less than $10^{-5}$. Using this approximation, the model of FIG. 17 can be implemented on a more practical architecture such as that shown in FIG. 18.

The generalized simulator of FIG. 18 implements even powers as well as odd powers of x. The coefficients SIMpbxy can be programmed to reflect the decimator and filtering used for the feedback. This allows straightforward treatment of class AD modulation, where it is convenient to re-define x so that pulse length is a proportion (1+x)/2 of the PWM switching period, and x is zero in the no-signal condition. "PSe" in FIG. 18 represents an estimate of $V_{cc}$. "NS" in FIG. 18 is to be identified with the noise shaper of FIG. 3, thus FIG. 18 is able to produce an output whose linear term is been noise shaped but whose nonlinear terms are derived from the signal before noise shaping.

It is desirable that the simulator model the behavior of the measurement path under overload conditions as well as during normal operation. Since the pulse length cannot exceed 100% of the repetition period, it is desirable that x be limited so that |x|≦1. If, in the amplifier of FIG. 3, the noise shaper incorporates internal clipping, this can be arranged automatically. If not, or if part of the input to the simulator is taken prior to noise-shaping as envisaged in FIG. 18, then a signal limiting device may be inserted immediately after LDC in FIG. 3 in order to enforce the condition |x|≦1.

The filter LPF$^{-1}$ displayed above has two zeroes in the z-domain. For reasons to be explained, its order and coefficients are chosen so that its zeroes cancel the s-domain poles of the analog lowpass filter. Specifically, the lowpass filter has two coincident poles at $s = 0.25$ $\mu s^{-1}$, from which the zeroes of LPF$^{-1}$ are calculated as:

$$z = \exp(-s \cdot \tau) = \exp(-0.25 \times 1 \text{ MHz}/384 \text{ kHz}) = \exp(-0.65104) = 0.5215$$

Hence:

$$LPF^{-1} = (z - 0.5215)^2 / z^2 / (1 - 0.5215)^2 = 4.36757 - 4.55540 \cdot z^{-1} + 1.18783 \cdot z^{-2}$$

More generally, the lowpass filter may be of higher order and/or have complex poles, in which case LPF$^{-1}$ will be of higher order and/or have complex zeroes, again calculated by pole-zero matching.

Sampling Point and Computational Delay

Comparing the conceptual simulator of FIG. 17 with the polynomial approximations above for d(x, .), we can ignore nonlinear terms and derive small-signal response of the simulator (ignoring the multiplication by $V_{cc}$) as:

$$0.0819616 \cdot z^{-1} + 0.8066498 \cdot z^{-2} + 0.0438820 \cdot z^{-3} + 0.0784520 \cdot z^{-4} - 0.1146495 \cdot z^{-5} + 0.0921093 \cdot z^{-6} + 0.0115946 \cdot z^{-7}$$

The common factor $z^{-1}$ makes possible the inclusion of the simulator within a loop such as that of FIG. 3 that does not have other delay elements, without creating a delay-free feedback loop.

The $z^{-1}$ delay can be understood also with reference to FIG. 14. We identify samples at the switching frequency $fs_{PWM}$ with the time instants t=0, 16, 32, 48 etc. in FIG. 14. An input to the pulse width modulator at t=0 is able to modulate the pulse centered on t=8, and this has an influence on the waveform in FIG. 16 at the next sampling instant t=16. There is thus a delay of precisely one $fs_{PWM}$ sample before the first response of the measurement path is seen. Ideally, this response would be fed round the feedback loop of FIG. 3 and would influence the width of the next PWM pulse (not shown) that is centred on t=24.

This ideal situation is hard to realize in practice as x becomes close to 1 and the pulse edges become closer to the sampling points. Any delay in the pulse width modulator, or computational delay in the signal path that feeds it, will make it impossible for a signal received at t=16 to control a symmetrical pulse centered on t=24 whose leading edge approaches t=16. Conversely, any delay in the measurement path will mean that the trailing edge of the pulse centred on t=8 is not able to influence the sample at t=16 to the intended extent.

One way to address this problem is insert an extra sample of delay in the feedback loop, so that the measurement of the pulse that is centred on t=8 does not influence the pulse that is centred on t=24 but instead has its first effect on the pulse that is centred on t=40. This creates timing slack so that computational delay can be accommodated and also allows the sampling points to be moved slightly later in time to account for any delay in the measurement path. The simulator is given an additional factor $z^{-1}$ so that its small-signal response (ignoring the multiplication by $V_{cc}$) is:

$$0.0819616.z^{-2} + 0.8066498.z^{-3} + 0.0438820.z^{-4} +$$
$$0.0784520.z^{-5} - 0.1146495.z^{-6} + 0.0921093.z^{-7} + 0.0115946.z^{-8}$$

However, this solution is non-optimal because the additional factor $z^{-1}$ in the feedback loop reduces its effectiveness in correcting errors.

An alternative is perform the sampling at some point within the PWM frame, i.e. between t=0 and t=16 in FIG. 14, so that the next pulse can be influenced in response to the sample even at full modulation (x=1) and allowing for computational delay. One scheme is to sample at the pulse centres t=8, t=24, t=40 etc. or just slightly afterwards to allow for delay in the measurement path. If using class AD modulation, this is mathematically attractive because modulation will not cause a pulse edge to cross a sampling point, so all the d(x, .) functions will be continuous and analytic, leading to good approximation by a low-order polynomial.

Another scheme is to sample later in the PWM frame, but still allowing sufficient time for the sample value to influence the next pulse, allowing for computational etc. delays. In this scheme, there will be a qualitative change in behavior when the value of x is such as to cause the trailing edge of the modulated pulse to cross the sampling point, and it will not be possible to approximate the d(x, .) functions as accurately using low order polynomials. Deeper analysis reveals, however, that if the decimation filter has been designed properly, distortion caused by inaccuracy of the polynomial approximation can be substantially confined to the ultrasonic region. In order to make this happen, the polynomials approximating the d(x, .) functions may need to be optimized jointly rather than individually, with a frequency domain weighting applied to the error criterion.

High-rate Simulator

There are many architectures that can be used to model the measurement path. An alternative simulator that is intended for use with an oversampling ADC, and in which the simulation is performed at the higher clock frequency $fs_{ADC}$ is therefore described below.

In FIG. 19, the signals u and e are the input to the PWM modulator and the feedback error signal, and are to be identified with the corresponding signals u and e in FIG. 3. Thus, FIG. 19 provides a replacement for the right-hand half of FIG. 3.

In FIG. 19, the pulse width modulator receives an input signal u and produces an analog PWM waveform that drives the output power switches. The output from the power switches is filtered by an analog lowpass filter and feeds an ADC modulator operating at a high oversampling frequency $fs_{ADC}$ of, for example, 6.144 MHz. The output of the modulator feeds a digital decimation filter before being downsampled by a factor of, for example, n=16, to produce an output at a frequency $fs_{PWM}$. A digital filter $LPF^{-1}$ substantially compensates, within the Nyquist range, the effect of the analog lowpass filter.

The measurement path in FIG. 19 is thus identical to that of FIG. 3 if the unit marked "ADC" in FIG. 3 is expanded as shown in FIG. 4.

The input u to the pulse width modulator in FIG. 19 is fed also to an edge timing determination unit, which derives the timings of the leading and trailing edge of the pulse that will be produced by the pulse width modulator. This information is passed to the antialiassed sampler which provides a sampled representation, at sampling frequency $fs_{ADC}$, of the pulse that will be produced by the pulse width modulator. The antialiassed sampler's output sequence is then filtered by a digital lowpass filter before being subtracted from the output of the ADC modulator.

The edge timing determination unit, the antialiassed sampler and the digital lowpass filter together form a simulator as shown, the functional difference from the simulator S FIG. 3 being that its output is provided at the higher sampling rate $fs_{ADC}$ and is therefore subtracted from the measurement path before decimation, rather than afterwards.

Considering now the antialiassed sampler in more detail, if the pulse edge timings were quantized to beats of the $fs_{ADC}$ clock, the sampler's task would be trivial: for example it would emit the sequence:

−1, −1, −1, −1, +1, +1, +1, +1, +1, +1, +1, −1, −1, −1, −1 to represent the pulse of length eight clock beats that has been discussed with reference to FIG. 14. A simple method to represent a pulse whose length is not so quantized is to use linear interpolation. For example, a pulse of length 8.4 units with rising edge at t=3.8 and falling edge at t=12.2 could be represented by the sequence:

−1, −1, −1, −0.6, +1, +1, +1, +1, +1, +1, +1, −0.6, −1, −1, −1

This 'linear interpolation' method is equivalent to convolving the continuous-time PWM pulse with a narrow rectangular pulse of width one $fs_{ADC}$ clock before sampling at frequency $fs_{ADC}$. The person skilled in the art will be aware that it would alternatively be possible to convolve with a B-spline having a knot spacing of one $fs_{ADC}$ clock, for better rejection of alias products, and that many other interpolation possibilities exist.

The antialiassed sampler also multiplies its output sequence by a digital estimate of $V_{cc}$, in order to model the effective analog multiplication performed by the output switches.

The digital lowpass filter in FIG. 19 is intended primarily to mimic the effect of the analog lowpass filter. For example if the analog filter were an all-pole filter, then the digital filter could also be all-pole where a pole at $s=s_p$ in the analog filter is matched by a pole at $z=z_p=\exp(\tau.s_p)$ in the digital filter, where $\tau=1/fs_{ADC}$. The small-signal transfer functions of the ADC and of the output switches, if they differ from unity, can also be folded into this filter. Pure delay in the drive circuitry need not appear in the filter, as it can be accounted for in the edge timing determination unit.

The response of such a digital filter can differ significantly near the Nyquist frequency from the response of the analog filter. The difference may be reduced very substantially by using B-spline convolution in the antialiassed sampler, where the order of the B-spline is one less than the order of the analog filter, for example a quadratic B-spline would be used with a third order analog filter.

The digital lowpass filter may be further adjusted to model delay and other non-idealities in the small-signal transfer function of the power switches and the ADC modulator.

The pulse width modulator in FIG. 19 may be able to furnish the edge timings required by the antialiassed sampler, and if this is the case the edge timing determination unit will not appear as a dedicated component of the simulator: the simulator will receive its input from the pulse width modulator in this case.

In the context of the amplifier of FIG. 3, the filter $LPF^{-1}$ in FIG. 19 can be omitted if the high rate simulator is used. In this case, within the design procedure for H that we shall now describe, the transfer function "$LPF^{-1}$" should be replaced by unity.

Feedback Loop Filter However

With reference to FIG. 3, the features described so far are directed towards minimising the signal delay through the measurement path (FIG. 12), and also towards ensuring that the simulator in FIG. 3 accurately models the measurement path so that the transfer function from u to e is close to zero over the full Nyquist range $0-fs_{PWM}/2$.

If we assume that the transfer function from u to e is actually zero, then the effect of the feedback is easily computed since recirculation does not need to be considered. The feedback will multiply the effect of a disturbance in the power switches by a transfer function $$NTF=1-H.P \qquad \text{Equation 3}$$

where H is the small signal transfer function of the feedback filter, and P is the combined small signal transfer function of LDC, the noise shaper, the pulse width modulator, the power switches, the analog lowpass filter, the ADC and $LPF^{-1}$. Thus, H.P is the combined transfer function of all the components, other than the simulator, that form the feedback loop in FIG. 3

For complete suppression of power switch errors, we would require NTF=0, hence H.P=1, hence $H=P^{-1}$. That is unlikely to be possible, because it is unlikely that P will have a causal inverse. To make further progress, we decompose P as $$P=M.A \qquad \text{Equation 4}$$

where M is minimum-phase, and A is allpass.

The likely contributors to M are the decimation filter; the analog lowpass filter (which, however, is partially compensated by $LPF^{-1}$,) droop from the pulse width modulator (c.f. FIG. 2 which, however, may be partly compensated by the correction unit LDC.) In addition, M includes the gain of the power switches, which may vary if the power supply varies.

Contributors to A include the intrinsic delay of the pulse width modulator, propagation delay through the analog and digital electronics, and computational delay. These factors impact A through their effect on the choice of sampling point as already discussed. The decimation filter may also contribute to A, for although it is designed as a minimum-phase filter at its sampling rate of $fs_{ADC}$, its effect when viewed through a sampling process at $fs_{PWM}$ is not necessarily minimum phase. A similar consideration applies to the analog lowpass filter.

Only the minimum-phase component of P is causally invertible. If we choose $$H=M^{-1} \qquad \text{Equation 5}$$

then substituting equations (5) and (4) in equation (3):

$$NTF=1-H.P=1-H.M.A=1-A$$

At DC, A=1 so the feedback will suppress very low frequency errors almost perfectly.

In the example configuration discussed above, with decimation filter as given in FIG. 5, second order lowpass filter with matched $LPF^{-1}$, and with the computational delay problem addressed by inserting an additional sample of delay in the feedback loop, we find that, A has a group delay at low frequencies of approximately 2.8 samples. This delay corresponds to a phase shift of 0.92 radians at 20 kHz when $fs_{PWM}=384$ kHz, whence |NTF|=0.88, i.e. errors are reduced by 1.1 dB at 20 kHz, or 12.8 dB at 5 kHz.

Although A is not causally invertible, it is possible to design a prediction filter H' that can substantially compensate the phase response of A over an operating frequency range that is less than the full Nyquist range 0 to $fs_{PWM}/2$. Study of equation (2) reveals that a minimum-phase filter having an amplitude response that increases above the operating frequency range, as sketched in FIG. 20, will have negative group delay near DC. Given such a filter H', if we now set $$H=M^{-1}.H' \qquad \text{Equation 6}$$

then we find:

$$NTF=1-A.H'$$

which gives the possibility of a smaller NTF, over the operating frequency range, than results when H is chosen using equation (5).

FIG. 20 shows an H' that rises above the operating frequency range but falls at still higher frequencies. The attenuation at higher frequencies may be necessary to prevent too much high frequency noise from the ADC from being injected through H into the main signal path.

To implement these principles, it is not necessary to design the two filters $M^{-1}$ and H' separately and then combine them. FIG. 21 tabulates the coefficients of a feedback filter H designed as a single filter with coefficients chosen by a linear least-squares optimization procedure, and FIG. 22 shows its amplitude response.

The optimization attempts to balance several criteria. Firstly, in order to provide maximum feedback advantage in the audio range, it attempts to minimize |1−H.P| evaluated at several frequencies over the range 0-20 kHz, with the greatest weight being given to low frequencies. Secondly, the optimization attempts to minimize $|H.LPF^{-1}.N_{ADC}|$ over the full Nyquist range, where $N_{ADC}$ is an estimate of the noise spectrum produced by the ADC, in order to control noise injection. Thirdly, there is some penalty attached to the response in the region of its maximum, in this case 39 kHz, in order to control the maximum gain |H.P| and hence provide some stability margin in the event that the simulator and measurement paths are not perfectly matched.

FIG. 23 and FIG. 24 provide further detail of the loop characteristics resulting from the loop filter H just described. FIG. 23 plots |H.P| on a decibel scale. This is the loop gain that would obtain if the simulator were removed. Denoting the simulator transfer function by S, the loop gain through H with the simulator present is |H.(P−S)|. A sufficient condition for stability is that |H.(P−S)|<1 at all frequencies. Rearranging this condition as:

$$|(P-S)/P| < 1/(H.P)$$

it follows that 1/(H.P) is an estimate of the proportional deviation of P from S that can be tolerated before stability ceases to be guaranteed. In FIG. 23, |H.P| peaks at about +20 dB, so P and S need to be matched within about 10% in order for the above condition stability to be met.

FIG. 23 does not differ greatly from FIG. 22 in this case. This is because the decimation filter has a substantially flat amplitude response in the frequency range considered, and the analog lowpass filter is substantially compensated by $LPF^{-1}$, so |P| differs only slightly from unity.

FIG. 24 is a decibel plot of |1−H.P|, also known as a Noise Transfer Function or NTF. From this, we deduce that errors in the audio range 0-20 kHz are reduced substantially, errors in the ultrasonic region 20 kHz-90 kHz approximately are increased by up to 20 dB, and errors above 90 kHz are not significantly affected. At 20 kHz, errors are reduced by 9.3 dB, to be compared with the estimate of 1.1 dB given previously for the H of equation 5 that does not incorporate prediction.

In practice, it may be preferred to limit the maximum gain of H much more severely than shown in FIG. 22 in order to provide stability that is more robust with respect to differences between P and S, and also to limit the maximum error amplification in the ultrasonic region. These advantages are at the expense of a smaller reduction of errors in the range 0-20 kHz.

The transfer function P includes the response of the decimation filter, which has so far been assumed to be approximately flat over the frequency range $0\text{-}fs_{PWM}/2$. However, there is freedom to adjust this response, and with suitable adjustment, M (equation 4) may be close to unity so the choice $H=M^{-1}$ would result in an H that is also close to unity, in which case the filter H may be omitted entirely.

Low Delay Correction Unit LDC

The filter H allows the small-signal loop transfer function to be adjusted to achieve the desired compromise between overall stability and effectiveness of feedback over the operating frequency range of, for example, 0-20 kHz. However, the transfer function of the pulse width modulator varies in response to large signals, as shown in FIG. 2. Depending on the desired amount of feedback, this variation may be significant in reducing the feedback at high signal excursions, and it is the function of the optional correction unit LDC to provide partial compensation for this effect. A design of LDC adapted to double-edged pulse width modulation is shown in FIG. 25.

In FIG. 25, the signal y is fed through a nonlinear function generator to form P(y), which is subtracted from y to furnish output signal x and also fed back though a filter with transfer function $5/2.z^{-1}-2.z^{-2}+2^{-3}/2$. The LDC unit feeds the pulse width modulator in FIG. 3, and the assumed scaling for x is that x=0 corresponds to a pulse of length zero length while x=1 corresponds to a pulse of length 100% of the switching period ($1/fs_{PWM}$).

Based on the model in FIG. 13, It can be shown that:

$$P(y)=y^3/12$$

sufficiently models the non-linearity, while perhaps slightly better is:

$$P(y)=0.08251487120y^3-0.01495088616y^5$$

The clip unit in FIG. 25 is provided to prevent out-of-range input signals from sending the feedback loop contained within FIG. 25 into persistent oscillation. A clipper operating at levels of ±0.125 would be satisfactory in the position shown.

The small signal amplitude response of FIG. 25, with $P(y)=y^3/12$, is plotted for pulse lengths equal to 0%, 50% and 100% of the switching period in FIG. 26. In each case, the response is minimum phase. When combined with the PWM nonlinearity of FIG. 2, the result is flat over the operating frequency range 0-20 kHz to a high degree of accuracy. For pulse lengths other than zero, the response of LDC must start to rise over this range to combat the droop shown in FIG. 2. However, for symmetrical double-edge modulation, the nonlinearity of FIG. 2 is phaseless, so the rising amplitude response must not be accompanied by a phase advance. The constant phase response is achieved to a reasonable degree of accuracy by making the amplitude response fall at higher frequencies, as shown in FIG. 26.

In addition to maintaining feedback effectiveness at high signal levels, the LDC unit provides another benefit. Without the LDC unit, ultrasonic noise originating from the ADC and injected via H into the main signal path, could intermodulate with itself in the nonlinearity of the pulse width modulator and produce intermodulation products within the audio band. This phenomenon has been discussed in 4 in relation to noise produced by a noise shaper. The corrector of FIG. 25 substantially compensates, within the operating frequency range, products generated by wideband or aliased ADC noise intermodulating with itself. The corrector is unable to correct products generated by intermodulation of noise from the noise shaper shown in FIG. 3.

Predistortion

In the prior art, feedback usually attempts to improve the linearity of a device such as an amplifier. However, feedback according to the present invention does not try directly to impose linear behavior, but rather to reduce the deviation from the behavior of a simulator. More precisely, referring to FIG. 3, the feedback attempts to achieve:

$$m_{feedback\ enabled} = s_{feedback\ disabled} \qquad \text{Equation 7}$$

over the operating frequency range, where m is the output of the measurement path and s is the output of the simulator. In the discussion that follows, we shall assume that equation 7 holds exactly.

The predistortion unit in FIG. 3 receives an input signal i and is designed to invert nonlinear aspects of the combination of LDC and S. It is assumed that the noise shaper can be disregarded in a large-signal analysis. Thus, the predistortion unit provides a corrected signal c such that, over the operating frequency range and with feedback disabled, the simulator output s closely follows a linearly filtered version of i. Hence by equation 7, when feedback is enabled, m will closely follow a linearly filtered version of i.

Of more direct interest, however, is the output o of the amplifier, which we assume to be in linear dependence on the output p of the power switches. We would therefore like to know that p is linearly related to the amplifier input i.

The path from p to m, comprising the analog lowpass filter, ADC and $LPF^{-1}$ unit, should be substantially linear. The path contains a sampling process, but the decimation filter should ensure that, over the operating frequency range, m is not significantly contaminated by alias products. Therefore, m should be linearly related to p over the operating frequency range. Consequently, if the combined effect of feedback and predistortion is to ensure that m is linearly related to i, it follows that p is linearly related to i. Thus, the amplifier as a whole is linear over the operating frequency range, as required.

Depending on the design of the predistortion unit, the small signal transfer function from i to p may or may not be a pure delay. If it is not pure delay, it can be compensated by a linear compensator placed prior to the predistortion unit. If desired, correction for the transfer function of the LC filter can also be applied at this point.

There are several ways to design a predistortion unit. One is to use the techniques of nonlinear system identification to derive a Volterra series expansion of the nonlinear system, and then to invert the Volterra series. A method that does not require advanced mathematics was proposed by Gerzon 1. First-order Gerzon correction is shown in FIG. 27. Gerzon's method corrects nonlinearity in a weakly nonlinear system whose small signal transfer function approximates a pure delay τ. The element N to the right of the dashed line in FIG. 27 represents the nonlinear system to be corrected. Gerzon's method requires one or more replicas of the nonlinearity to be corrected, hence another element N in the predistortion unit shown to the left of the dashed line. The first-order predistortion unit multiplies the input signal by two and delays by τ, then subtracts the distorted signal furnished by the replica nonlinear element N. The result of the subtraction is a predistorted signal. If the predistorted signal is fed to another nonlinear element N, the resulting output will, subject to conditions on N, contain substantially less distortion than if the input signal were fed to N directly.

Gerzon's method may be nested. That is, the total system of FIG. 27 can itself be considered as a nonlinear element that can be compensated in the same way. Gerzon 1 describes other methods by which the higher-order correction can be obtained.

Referring again to FIG. 3, if it is desired to make the simulator output (with feedback disabled) follow the input signal, then the predistortion unit must apply compensation for the cascaded combination of the LDC unit and the simulator S. (The noise shaper in FIG. 3 is assumed to have a unity transfer function and to be modelled by additive noise, which cannot be compensated.) If the element N in FIG. 27 is replaced by the cascade of LDC and S, we obtain FIG. 28, which is intended to be a replacement for the predistortion unit in FIG. 3.

The small signal transfer function of S is, in general, not completely flat in amplitude, nor linear in phase. It does not necessarily approximate a pure delay τ to the accuracy required for the Gerzon correction of FIG. 28 to be optimally effective. An improvement is to precede the cascade of LDC and S by a linear correction unit $S_{lin}^{-1}$ that substantially corrects the amplitude response of S and linearizes its phase response, so that $S_{lin}^{-1}.S$ approximates a pure delay at least over the operating frequency range. Thus, each N in FIG. 27 is replaced by ($S_{lin}^{-1}.LDC.S$). As there are two instances of N in FIG. 27, there are two instances of $S_{lin}^{-1}$ when the replacement is made. If $S_{lin}^{-1}$ is minimum phase, then each instance of LDC can be preceded immediately by an instance of $S_{lin}^{-1}$. However, linearising the phase response of S may require that $S_{lin}^{-1}$ have allpass factors, and if this is the case, $S_{lin}^{-1}$ should not appear inside the feedback loop. Therefore, both instances of $S_{lin}^{-1}$ are placed in the predistortion unit, as shown in FIG. 29. FIG. 29 in its entirety may be used as the predistortion unit shown in FIG. 3.

It is possible to derive predistortion independently of the simulator S, if a suitable model of the forward path from u to p is available. For example, if the output switches themselves are considered perfect, the path from u to p contains only the pulse width modulator, for which a variety of low-frequency models can be constructed, one of which has been shown in FIG. 13. Moreover, it the output switches are perfect, then the simulator S should model the measurement path very accurately, and the feedback signal f should be essentially zero. Under these circumstances, the path from i to p can be linearized by a predistortion unit that compensates the path from d to p.

Two alternative predistortion units adapted to compensate the path from d to p, i.e. the cascaded combination of LDC and the pulse width modulator, are shown in outline in FIG. 30 and FIG. 31. In FIG. 30, the Gerzon principle of FIG. 27 is applied directly to the cascaded combination of LDC and a model of the pulse width modulator. In FIG. 31, the Gerzon principle is applied to the pulse width modulator only, leaving LDC to be compensated by a separate unit $LDC^{-1}$.

FIG. 32 shows more detail of an example predistortion unit according to the principle of FIG. 31, i.e. using a separate compensator for LDC. The part of FIG. 32 to the left of the dotted line is derived from the corresponding part of FIG. 31, using the PWM model of FIG. 13.

The part of FIG. 32 to the right of the dotted line is a separately derived inverse of the LDC of FIG. 25. It is an exact inverse (up to the clip point) if the nonlinear function Q(x) satisfies:

$$Q(x)=P(x+Q(x))$$

Taking the simpler choice for P:

$$P(y)=y^3/12$$

this reduces to:

$$Q(x)=(x+Q(x))^3/12$$

There are various ways to approximate the solution to this equation to facilitate real-time computation. If only moderate accuracy is required, it may be adequate to take one or more terms of the power series expansion:

$$Q(x) = \frac{1}{12}x^3 + \frac{1}{48}x^5 + \frac{1}{144}x^7 + \frac{55}{20736}x^9 + \ldots$$

Similar methods can be used to furnish Q(x) for other choices of P.

FIG. 33 shows more detail of an example predistortion unit according to the principle of FIG. 30. The area labelled "ZDCORR" in FIG. 33 is to be identified with FIG. 25, "Pzd" being the polynomial P(y) discussed above. The area labelled "PWMCORR" implements a fifth order model of PWM nonlinearity that is conceptually similar to the third order model of FIG. 13. For implementation convenience, whereas FIG. 13 implements a single nonlinearity followed by a polynomial in $z^{-1}$, in FIG. 33 the terms have been grouped according to powers of $z^{-1}$ to form the polynomial nonlinearities P50 through P54. The dominant term would be a linear term in the polynomial P52, which is fed from a cascade of two $z^{-1}$ delay elements. This term has been removed from P52 and is accounted for instead by the path from the output of ZDCORR to the summation node at the top of FIG. 33. This transformation reduces the sensitivity of the final output to noise introduced by the quantizer Q that feeds feed the PWMCORR block, and thus allows a coarser quantizer to be used, for improved efficiency in implementing the polynomial nonlinearities P50 through P54.

Adaptation to a Varying Power Supply

Sometimes, a PWM amplifier is required to operate off an unstabilized power supply, in which case the supply voltage may deviate from its nominal value by 10% or more. With all commonly used output switch configurations, power supply variation causes variation of the forward gain. With some configurations it will also cause a varying DC offset, but here we shall consider gain variations only.

FIG. 34 shows an amplifier similar to the amplifier in FIG. 3 but with improvements directed towards maintaining performance when the power supply varies. A power supply estimation unit provides an estimate $PS_e$ of the gain of the output stage taking into account the power supply, and also its inverse $PS_e^{-1}$. It is convenient to assume that $PS_e$ is unity when the power supply voltage has its nominal value.

There are several ways in which the power supply estimation unit may operate. One would be to continuously characterize the gain of the amplifier, while another would be to continuously measure the power supply voltage, for example using an ADC.

As described previously with reference to FIG. 12 through FIG. 18, the simulator is designed to model the measurement path, and in particular its gain. FIG. 34 assumes a simulator having a fixed gain, followed by a multiplication by $PS_e$. An alternative, and better, procedure is to use a simulator as shown in FIG. 17 or FIG. 18 that provides explicit modeling of the effect of $V_{cc}$ or $PS_e$.

The feedback filter H is derived in dependence on the simulator, and as discussed previously, H substantially inverts the response of the filter M, defined by equation (4), which includes the gain of the power switches. In practice, it is more convenient to have a filter H that does not vary dynamically, but is followed by a multiplication by $PS_e^{-1}$, as shown in FIG. 34.

The elements described so far ensure that the feedback loop continues to operate correctly if the power supply voltage changes, but there remains a change in the gain of the forward path of the amplifier, which is not corrected. This may be corrected by multiplying the input signal by $PS_e^{-1}$, prior to the predistortion unit, as shown in FIG. 34.

Reference Path

The invention as described so far applies feedback to an amplifier via an ADC. The ADC has to handle the full dynamic range of the amplifier's output, hence the noise and distortion performance of the amplifier is unlikely to be better than that of the ADC.

It may or may not be convenient to incorporate an ADC of adequately high performance. The prior art feedback design described in U.S. Pat. No. 6,373,334 allows an ADC of reduced performance to be used. In this prior art design, the ADC is fed with the difference between a scaled version of the power switch output and a low-level PWM waveform produced by reference switches that are driven from the same pulse width modulator as the power switches. It is the design intention that this difference be small, thus reducing the dynamic range that has to be handled by the ADC. However, the difference is likely to increase if the gain of the power switches changes because of power supply variation.

FIG. 35 shows an amplifier incorporating a reference switch that is driven from a separate pulse width modulator, identified as "Pulse width modulator ref". The signal path along the top of the diagram is like that of the prior art amplifier of FIG. 1, save that the reference switch is a precision switch operating a low power level, and the output filter components L and C are omitted. Therefore, the reference output signal r will follow the input signal i to high precision, within the operating frequency range, be a high-precision replica of the input signal i. In particular, the gain from i to r can be assumed constant, since the reference switch will use a local stabilized voltage reference $V_{ref}$ (not shown), and thereby be immune from variations in $V_{cc}$.

In FIG. 35, the analog lowpass filter is shown as having a differential input. In practice, there will be resistive attenuation (not shown) between the output p of the power switches and the positive input of the filter. Another possibility is to invert digitally the drive to the reference switch, so that the signals p and r can be added rather than subtracted. Passive resistive summation can then be used prior to a filter having a single-ended input.

The design intention is that the signals from p and r should substantially cancel when they are combined, thereby substantially reducing the dynamic range requirement on the ADC. If passive resistive summation is used, the dynamic range handled by the lowpass filter is also reduced.

Also provided in FIG. 35 is a second simulator identified as "$S_{ref}$". This simulator is intended to model, apart from the sign inversion, the signal path from point $u_{ref}$ to point m, just as the simulator "$S_{main}$" models the path from $u_{main}$ to m. Therefore, taking into account both the path through the reference switch, and the path through $S_{ref}$, the gain from point $u_{ref}$ to point e should ideally be zero. Thus comparing FIG. 35 with FIG. 34, the addition of the reference switch and its simulator to the amplifier of FIG. 34 should ideally not affect the total performance save that the ADC in FIG. 35 is required to handle a smaller signal than the ADC in FIG. 34.

It is, however, necessary to be aware that, although the signals p and r in FIG. 35 may cancel substantially at audio frequencies, high frequency overload also needs to be considered. The signals at p and r are both PWM waveforms, but they do not in general have the same mark:space ratio. For example, the mark:space ratio of the waveform at p will vary in response to variations of $V_{cc}$ whereas the waveform at r is independent of $V_{cc}$. Therefore, even if the drive to the reference switch is inverted and passive resistive summation of the signals at p and r is used to provide a substantially zero result at low frequencies, there will remain transient fast edges that may need to be filtered passively before they reach active devices in the analog lowpass filter. Further, each of the signals r and p has a substantial component at $fs_{PWM}$. It will be advantageous to provide delay adjustment in the two pulse width modulators so that these two components at $fs_{PWM}$ can be substantially aligned in phase. Even if they are so aligned, however, the differing mark:space ratios will cause different amplitudes of the two components, so cancellation at $fs_{PWM}$ cannot be exact. This consideration may present a requirement for significant attenuation at $fs_{PWM}$ in the analog lowpass filter, taking into account the capability of the ADC to handle high frequencies.

The "Predistortion main" unit in FIG. 35 is not intended to be a functional replica of the "Predistortion ref" unit, because of the presence of LDC.

FIG. 35 provides for substantial cancellation between the signals that feed the ADC during normal operation, but if the amplifier clips, it is not guaranteed that the main and the reference paths will clip simultaneously, in which case larger signals can appear at the ADC. This problem is addressed in FIG. 36, which shows a detail of the amplifier of FIG. 35, but with the addition of a clip processor which has two outputs and provides two adjustment signals, which are then added to the two pre-clip signals $pec_{ref}$ and $pec_{main}$ to produce the post-clip signals $poc_{ref}$ and $poc_{main}$. In normal operation, the two adjustment signals are zero. If either of the two pre-clip signals exceeds the valid signal range handled by the pulse width modulators, for example −1 to +1, then the clip processor must emit an adjustment signal of opposite sign. For example, if $pec_{main}$ has the value 1.2, an adjustment signal of −0.2 added to the main path would give $poc_{main}$=1.0. If the reference path were not similarly modified, this perturbation would result in an uncanceled perturbation at the input to the ADC. Hence, the clip processor emits also an adjustment to the reference path. If the power supply voltage has deviated from its nominal voltage, this has a multiplicative effect on the perturbation, so with suitable assumptions about scaling, an adjustment of $-0.2 \times PS_e$, to the reference path would substantially cancel the perturbation seen by the ADC.

ALTERNATIVE EMBODIMENTS

The person skilled in the art will realize that various rearrangements of the diagrams provided herewith can be made without affecting the essential operation. For example, linear filtering operations can be interchanged in order without affecting the transfer function; they can be moved past addition or subtraction nodes provided suitable compensating adjustments are made to the other paths. Two conceptually distinct filters may be combined into one, and in some cases, the filter may disappear if the combined transfer function evaluates to unity. Addition and subtraction are essentially equivalent, if sign is adjusted elsewhere.

As an example, and without prejudice to the generality of the foregoing, in FIG. 3 the filter $LPF^{-1}$ may be deleted and an inverse filter LPF inserted following the simulator S. The balance between the simulator path and the measurement path is not disturbed by this change, and the small signal transfer function of the feedback loop may be restored to its previous value by a suitable adjustment to H.

Scaling factors have been omitted from this description for clarity. Signals, whether analog or digital, may be scaled according to convenience: the multiplications, divisions, amplifications and attenuations that may be used to optimize scaling in a practical implementation have not been shown.

The use of a pair of on/off switches to represent a power switch should not be taken as limiting. The skilled person will be able to adapt to the principles described herein to full-bridge designs in which analog signals are balanced, and to other more complex types of modulation. The power switch may similarly be replaced by a composite assembly that itself includes feedback.

A number of exemplary embodiments having alternative structures will be described below to illustrate some of the variations that are possible within the scope of the invention.

One embodiment comprises an amplifier having: a pulse width modulator receiving a digital input; a power switch that produces a power switch output; and an output that is connected to the power switch output. The amplifier also includes: a simulator that receives an input signal substantially similar to the signal received by the pulse width modulator; an ADC (analogue-to-digital converter) having an input connected to the power switch output; a subtractor having a first input that is connected to the output of the simulator, and a second input that is connected to the output of the ADC, where the input to the pulse width modulator is modified in dependence on the output of the subtractor.

One embodiment also includes a noise shaper in which the simulator has a first input and a second input, the second input being fed in dependence on the output of the noise shaper. In one embodiment, the response of the simulator to its second input is substantially linear.

One embodiment also includes a low level switch whose switch timings are controlled by a digital modulator, wherein the input to the ADC is formed in dependence on the difference between the power switch output and the output of the low level switch.

One embodiment also includes a low level switch that receives an input from a second modulator. One embodiment also includes a second simulator that receives an input signal substantially similar to the signal received by the second modulator.

In one embodiment, the simulator models nonlinear characteristics of the pulse width modulator. In one embodiment, the simulator models known imperfections of the power switch. In one embodiment, the simulator models delay or other allpass characteristics of the signal path from the input of the pulse width modulator to the second input of the subtractor. In one embodiment, the simulator comprises an FIR filter whose input is connected to a nonlinear function generator that generates an arithmetic power of an input signal. In one embodiment, the signal path from the power switch output to the ADC comprises a lowpass filter.

In one embodiment, the signal path from the ADC to the second input of the subtractor comprises an FIR (finite impulse response) filter. In one embodiment, the transfer function zeroes of the FIR filter substantially cancel poles in the transfer function of the signal path from the power switch output to the input of the ADC.

One embodiment also includes a calibration unit that characterizes, at start-up, the signal path from the power switch output to the input of the ADC, and configures at least one of: (i) the simulator; or (ii) the signal path from the ADC to the second input of the subtractor; in dependence on the characterization. One embodiment includes a calibration unit that continuously characterizes the signal path from the power switch output to the input of the ADC, and adapts a parameter governing the behaviour of of: (i) the simulator; or (ii) the signal path; from the ADC to the second input of the subtractor responsively to the characterization. In one embodiment, the calibration unit adjusts parameters governing the amplifier behavior, where the adjustment is made in response to a correlation calculated in dependence on the output of the subtractor.

One embodiment also includes a filter in the signal path from the subtractor to the input of the pulse width modulator, wherein the filter is substantially minimum phase and has an amplitude response that rises at frequencies above an operating frequency range.

One embodiment also includes a nonlinear correction unit in the signal path from the subtractor to the input of the pulse width modulator, the correction unit substantially correcting, over an operating frequency range, a proportion of the nonlinear effects in the pulse width modulator. In one embodiment, the small signal transfer function of the nonlinear correction unit is minimum phase. One embodiment also includes a predistortion unit that substantially compensates the nonlinear effects in the pulse width modulator that are not compensated by the nonlinear correction unit. In one embodiment, the predistortion unit is modified by at least low frequency components of a signal determined in dependence on the output of the subtractor.

One embodiment comprises an amplifier having: a digital modulator that operates at a first sampling frequency; power devices that produce an output; an ADC that receives an input in dependence on the output of the power devices and that operates at a second sampling frequency that is a multiple of the first sampling frequency; and a decimator that receives the output of the ADC, the decimator comprising a decimation filter. In this embodiment, the input to the digital modulator is modified in dependence on the output of the of the decimator, and wherein the decimation filter has transfer function zeroes some of which lie, in the complex z-plane, at positions significantly away from positions on the unit circle that correspond to the first sampling frequency and its harmonics.

One embodiment comprises a switching amplifier having: a pulse width modulator that provides a low-level PWM waveform; a power switch that produces a power switch output; and an oversampling ADC followed by a decimator. In this embodiment, the ADC is responsive to the difference between a signal derived from the low-level PWM waveform and a signal derived from power switch output, and wherein the input of the power switch is responsive to the output of the decimator.

One embodiment comprises a switching amplifier having: a pulse width modulator that provides a low-level PWM waveform; a power switch that produces a power switch output; an ADC that is responsive to the difference between a signal derived from the low-level PWM waveform and a signal derived from power switch output; and a shaping filter whose input is connected to the output of the ADC and whose response rises above the operating frequency range. In this embodiment, the input of the power switch is responsive to the output of the shaping filter.

One embodiment comprises a switching amplifier having: a pulse width modulator that provides a low-level PWM waveform; a power switch that produces a power switch output; an ADC that is responsive to the difference between a signal derived from the low-level PWM waveform and a signal derived from power switch output; and a low-delay corrector whose input is responsive to the output of the ADC, the corrector providing approximate or substantial correction, over the operating frequency range, for the nonlinear behavior of a pulse width modulator. In this embodiment, the input of the power switch is responsive to the output of the low-delay corrector.

Those of skill will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

REFERENCES

1. Gerzon, M. A., "Predistortion Techniques for Complex but Predictable Transmission Systems", J. Audio Eng. Soc., Volume 20, pp. 475-482 (July 1972).
2. Bode, H. W., "Network Analysis and Feedback Amplifier Design", Litton, 1945; reprinted Van Nostrand, New York, 1959; reprinted Krieger, New York 1975 ISBN 0-88275-242-1.
3. Harris, S., Andersen, J., and Chieng, D., "Intelligent Class D Amplifier Controller Integrated Circuit as an Ingredient Technology for Multi-Channel Amplifier Modules of Greater than 50 Watts/Channel" Presented at the AES 115th Convention 2003 Oct. 10-13 New York, Audio Eng. Soc. preprint # 5947
4. Craven, P. G., "Toward the 24-bit DAC: Novel Noise-Shaping Topologies Incorporating Correction for the Nonlinearity in a PWM Output Stage", J. Audio Eng. Soc., Volume 41 Number 5 pp. 291-313; May 1993
5. Hawksford, M. O. J, "Dynamic Model-Based Linearization of Quantized Pulse-Width Modulation for Applications in Digital-to-Analog Conversion and Digital Power Amplifier Systems", J. Audio Eng. Soc., Volume 40 Number 4 pp. 235-252; April 1992
6. Sandier, M., "Towards a Digital Power Amplifier" Audio Eng. Soc Preprint Number: 2135, September 1984
7. Norsworthy, S. R., Schrier, R, Temes, G. C. (editors), "Delta-Sigma Data Converters: Theory, Design and Simulation", IEEE Press 1997, ISBN 0-7803-1045-4.

What is claimed is:

1. A system comprising:
a signal processing plant implemented in a digital pulse width modulation (PWM) amplifier, wherein the plant is configured to receive and process an input audio signal to generate an output audio signal;
a simulator configured to model processing of audio signals by the plant, wherein the simulator is configured to receive the input audio signal and to generate a simulator output signal; and
a subtractor configured to receive the output audio signal and the simulator output signal and to generate a correction signal, wherein the input audio signal is modified based on the correction signal.

2. The system of claim 1, wherein the plant comprises a pulse width modulator and a power switch, wherein the power switch is configured to receive a modulated output of the modulator and to generate the output audio signal.

3. The system of claim 2, wherein the output audio signal comprises an analog output signal, wherein the system further comprises an analog-to-digital converter (ADC) configured to digitize the analog output signal and thereby produce the output audio signal.

4. The system of claim 3, further comprising a lowpass filter configured to filter the analog output signal received from the power switch and to provide the filtered analog output signal to the ADC.

5. The system of claim 3, further comprising a FIR (finite impulse response) filter configured to filter the digitized output audio signal received from the ADC and to provide the filtered digitized output audio signal to the subtractor.

6. The system of claim 3, wherein the ADC comprises an oversampling ADC, and wherein the system further comprises a decimator configured to decimate the digitized output audio signal received from the ADC and to provide the decimated digitized output audio signal to the subtractor.

7. The system of claim 1, wherein the plant comprises a noise shaper.

8. The system of claim 1, wherein the response of the simulator is substantially linear.

9. The system of claim 1, wherein the response of the simulator is non-linear.

10. The system of claim 1, wherein the response of the simulator includes delay introduced to the output audio signal by the plant.

11. A method for correcting an output audio signal generated by a signal processing plant in a digital pulse width modulation (PWM) amplifier, the method comprising:
receiving an input audio signal;
providing the input audio signal to a signal processing plant and to a simulator, wherein the simulator is configured to model processing of signals by the plant;
processing the input audio signal within the plant to generate a plant output signal;
processing the input audio signal with the simulator to generate a simulator output signal;
determining a difference between the plant output signal and the simulator output signal; and
modifying the input audio signal based on the difference between the plant output signal and the simulator output signal.

12. The method of claim 11, wherein the plant comprises a pulse width modulator and a power switch, and wherein processing the input audio signal within the plant comprises modulating the input audio signal to produce a pulse width modulated (PWM) signal and controlling the power switch to generate an analog output audio signal.

13. The method of claim 12, further comprising converting the analog output signal to a digital output audio signal.

14. The method of claim 13, further comprising lowpass filtering the analog output signal generated by the power switch prior to converting the analog output signal to the digital output audio signal.

15. The method of claim 13, further comprising performing finite impulse response (FIR) filtering on the digitized output audio signal after converting the analog output signal to the digital output audio signal.

16. The method of claim 13, wherein converting the analog output signal to the digital output audio signal comprises oversampling the analog output signal, the method further comprising decimating the digitized output audio signal.

17. The method of claim 11, wherein the plant comprises a noise shaper, and wherein processing the input audio signal within the plant comprises quantizing and noise shaping the input audio signal.

18. The method of claim 11, wherein processing the input audio signal with the simulator comprises performing substantially linear processing on the input audio signal.

19. The method of claim 11, wherein processing the input audio signal with the simulator comprises performing non-linear processing on the input audio signal.

20. The method of claim 11, wherein processing the input audio signal with the simulator comprises introducing delay to the output audio signal.

* * * * *